(12) United States Patent  
Karamcheti et al.

(10) Patent No.: US 9,093,150 B2  
(45) Date of Patent: Jul. 28, 2015

(54) MULTI-CHIP PACKAGED INTEGRATED CIRCUIT WITH FLASH MEMORY AND SLAVE MEMORY CONTROLLER

(71) Applicants: Vijay Karamcheti, Los Altos, CA (US); Kumar Ganapathy, Los Atlos, CA (US)

(72) Inventors: Vijay Karamcheti, Los Altos, CA (US); Kumar Ganapathy, Los Atlos, CA (US)

(73) Assignee: Virident Systems, Inc., San Jose, CA (US)

( * ) Notice: Subject to any disclaimer, the term of this patent is extended or adjusted under 35 U.S.C. 154(b) by 0 days.

(21) Appl. No.: 14/016,224

(22) Filed: Sep. 3, 2013

(65) Prior Publication Data

US 2014/0071755 A1 Mar. 13, 2014

Related U.S. Application Data

(62) Division of application No. 12/369,733, filed on Feb. 11, 2009.

(60) Provisional application No. 61/028,183, filed on Feb. 12, 2008.

(51) Int. Cl.
| | |
|---|---|
| *G11C 16/04* | (2006.01) |
| *G06F 12/06* | (2006.01) |
| *G06F 17/30* | (2006.01) |
| *G06F 12/02* | (2006.01) |

(52) U.S. Cl.
CPC ........ *G11C 16/0408* (2013.01); *G06F 12/0246* (2013.01); *G06F 12/0607* (2013.01); *G06F 17/30477* (2013.01); *G06F 12/0207* (2013.01); *G06F 2212/7201* (2013.01); *G06F 2212/7208* (2013.01); *Y02B 60/1225* (2013.01)

(58) Field of Classification Search
CPC .......................... H01L 25/0657; H01L 25/065

USPC .......... 257/686, 685, 777, 723, 728, E23.069, 257/E25.013, E23.02, 415, 416, 420, 257/E29.07; 365/63, 51

See application file for complete search history.

(56) References Cited

U.S. PATENT DOCUMENTS

| | | | | |
|---|---|---|---|---|
| 6,064,254 | A * | 5/2000 | Vogley et al. | 327/565 |
| 6,877,020 | B1 * | 4/2005 | Bratt et al. | 708/400 |
| 7,464,225 | B2 * | 12/2008 | Tsern | 711/115 |
| 7,814,337 | B2 * | 10/2010 | Lee et al. | 713/193 |
| 7,921,303 | B2 * | 4/2011 | Mauro, II | 713/193 |
| 8,593,847 | B2 * | 11/2013 | Kim | 365/51 |
| 2002/0069252 | A1 * | 6/2002 | Jones et al. | 709/206 |
| 2002/0069308 | A1 * | 6/2002 | Jones et al. | 710/5 |
| 2005/0146008 | A1 * | 7/2005 | Miyamoto et al. | 257/686 |
| 2007/0070669 | A1 * | 3/2007 | Tsern | 365/51 |
| 2008/0080261 | A1 * | 4/2008 | Shaeffer et al. | 365/189.05 |
| 2009/0210616 | A1 * | 8/2009 | Karamcheti et al. | 711/105 |
| 2009/0254689 | A1 * | 10/2009 | Karamcheti et al. | 710/301 |
| 2011/0228614 | A1 * | 9/2011 | Shaeffer et al. | 365/189.04 |
| 2014/0071729 | A1 * | 3/2014 | Kim | 365/51 |
| 2014/0157090 | A1 * | 6/2014 | Shalvi et al. | 714/773 |

* cited by examiner

*Primary Examiner* — Alexander Oscar Williams
(74) *Attorney, Agent, or Firm* — Alford Law Group, Inc.; William E. Alford

(57) ABSTRACT

A multi-chip packaged integrated circuit part for mounting to a printed circuit board of a memory module. The multi-chip packaged integrated circuit part comprises an integrated circuit package including a slave memory controller (SMC) die; and pairs of a spacer under the slave memory controller die, and a flash memory die under the spacer. In each pair, the flash memory die may be larger than the spacer so that an opening is provided into a perimeter of the flash memory die to allow electrical connections to be made. A plurality of conductors may be used to electrically couple the slave memory controller die and the flash memory die to one or more pads of a pin-out of the integrated circuit package.

13 Claims, 14 Drawing Sheets

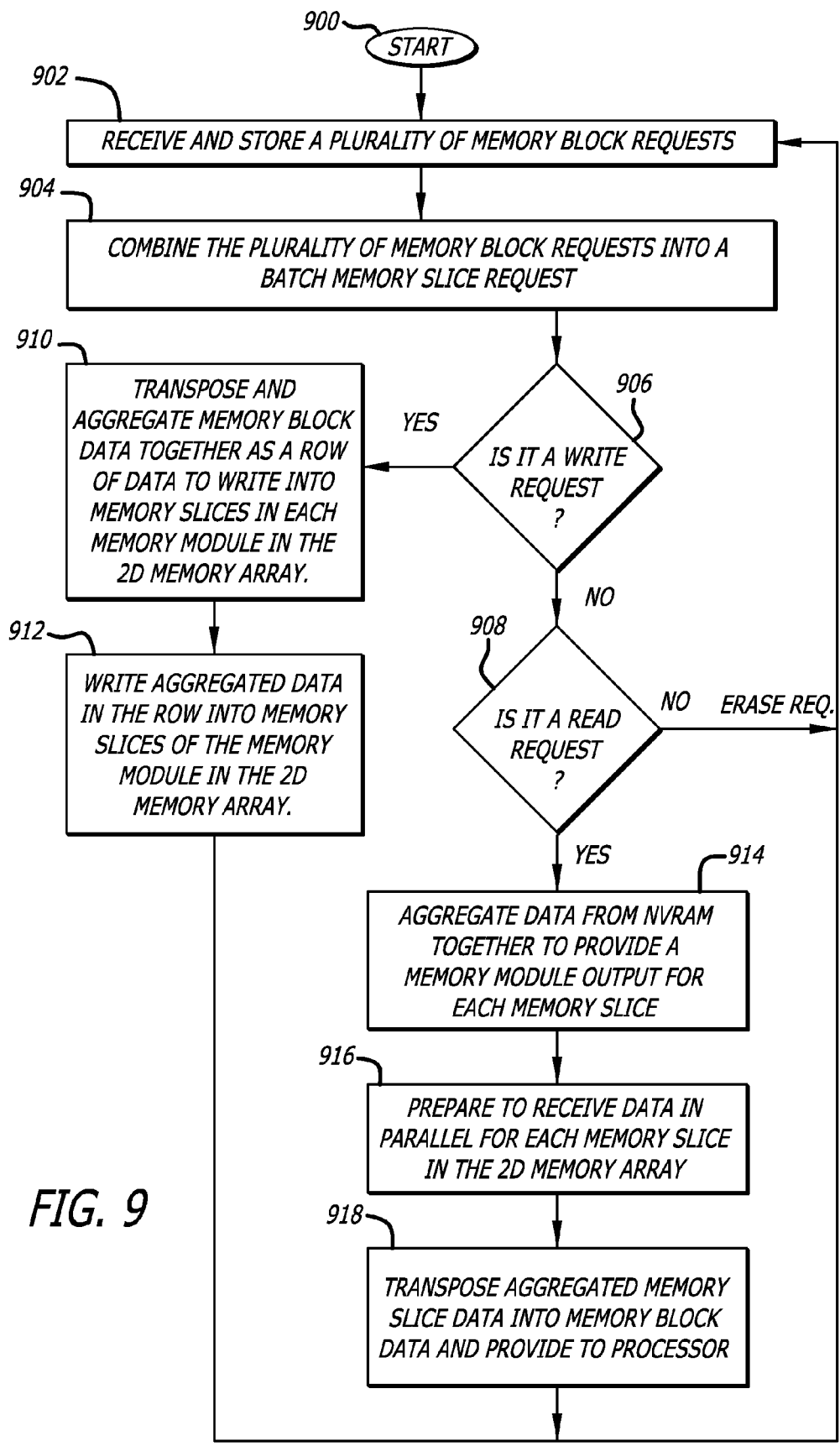

MULTI-CHIP PACKAGED INTEGRATED CIRCUIT WITH FLASH MEMORY AND SLAVE MEMORY CONTROLLER

CROSS REFERENCE TO RELATED APPLICATIONS

This patent application is a divisional and claims the benefit of U.S. patent application Ser. No. 12/369,733, entitled METHODS FOR UPGRADING COMPUTER SYSTEMS WITH TWO-DIMENSIONAL MEMORY MODULES AND MASTER MEMORY CONTROLLERS, filed on Feb. 11, 2009 by inventors Vijay Karamcheti, et al., pending. U.S. patent application Ser. No. 12/369,733 claims the benefit of U.S. Provisional Patent Application No. 61/028,183, entitled METHODS AND APPARATUS FOR TWO-DIMENSIONAL MAIN MEMORY, filed on Feb. 12, 2008 by Vijay Karamcheti et al.

FIELD

This application generally relates to main memory with memory modules and the methods of storing and accessing data therein.

BACKGROUND

A computing system may have a main memory that is randomly accessed over a memory channel a single address at a time per memory transaction. Sometimes a data bus in a memory channel of the main memory may be idle waiting for the next address and memory transaction to occur. The idle time can lower the data bandwidth of a memory channel.

With low latency memory modules, the data bandwidth of a memory channel lost from idle time is less significant. However if memory modules with a higher latency or a variable latency are introduced into the main memory, the data bandwidth loss may become more significant.

BRIEF SUMMARY

The embodiments of the invention are best summarized by the claims that follow below.

BRIEF DESCRIPTIONS OF THE DRAWINGS

FIG. 9 is a flow chart of a method of operation of a two-dimensional memory array.

Figure 12A:
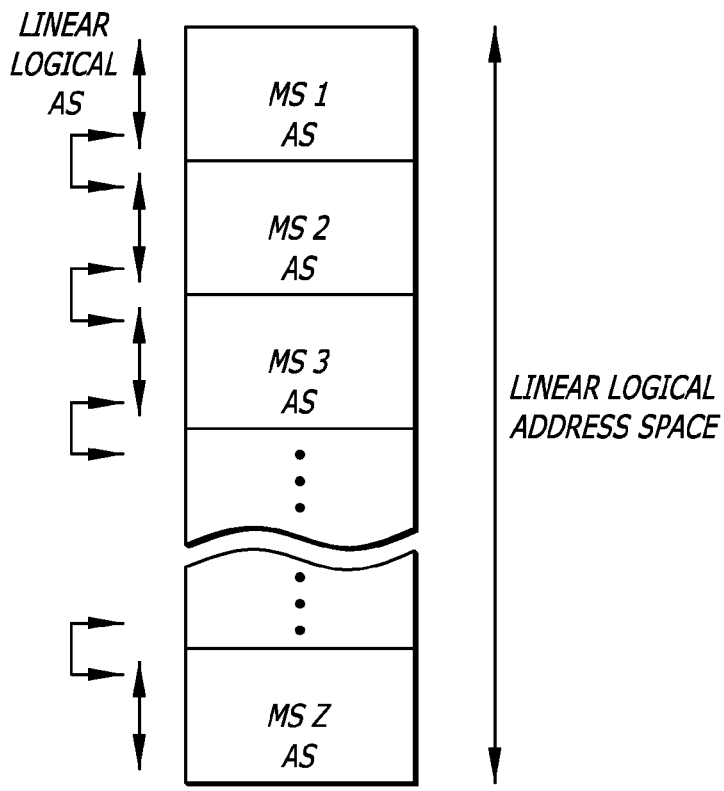
Figure 12B:
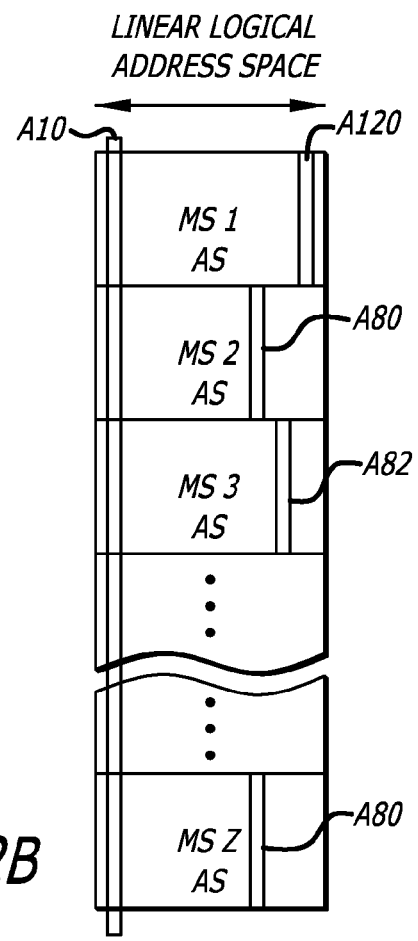

FIGS. 12A-12B illustrated block diagram of linear address maps for the plurality of memory slices from points of view of the processor and the master memory controller, respectively.

Figure 13A:
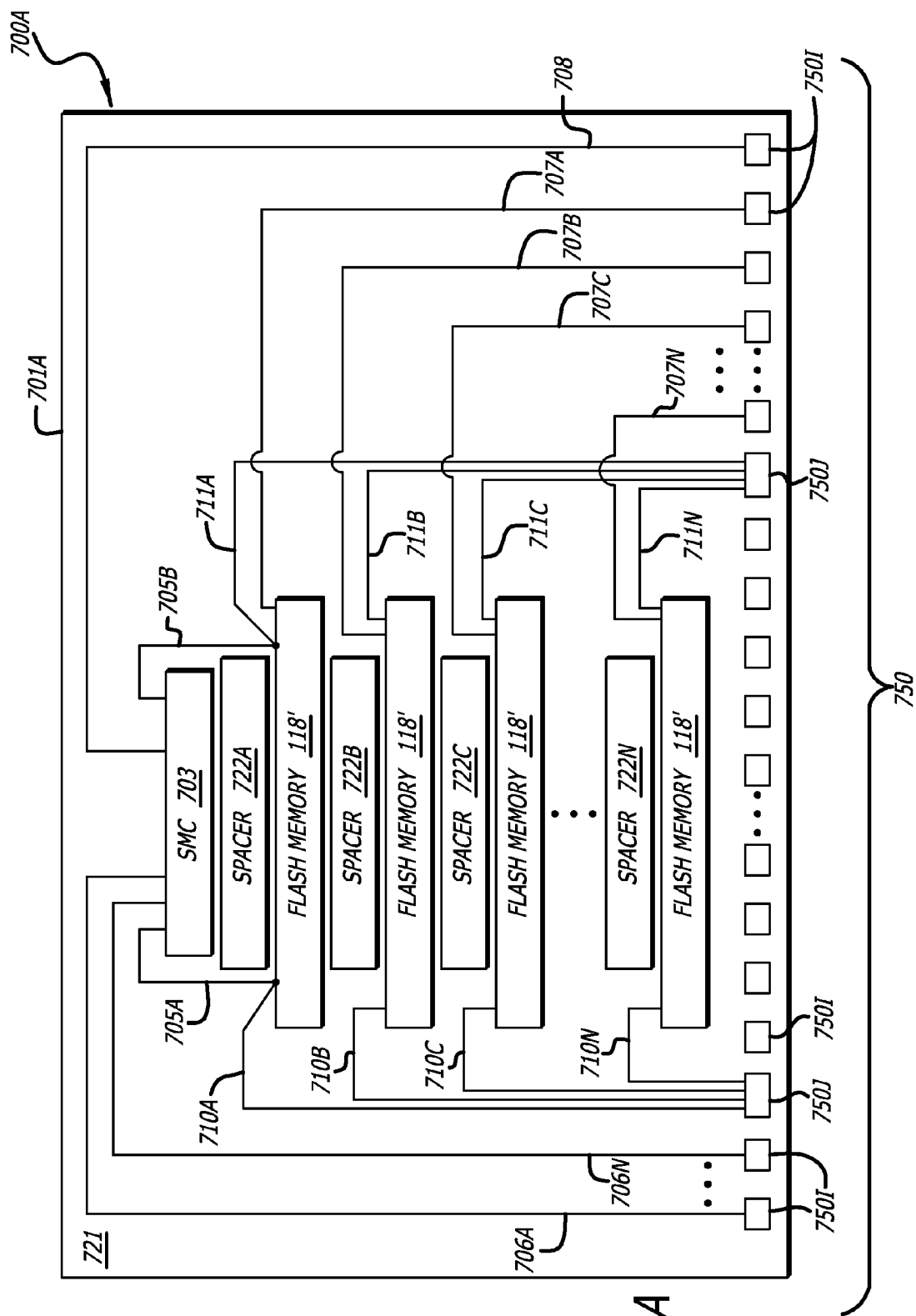

FIG. 13A is a side cutaway view of a first multi-chip package for a memory slice.

Figure 13B:
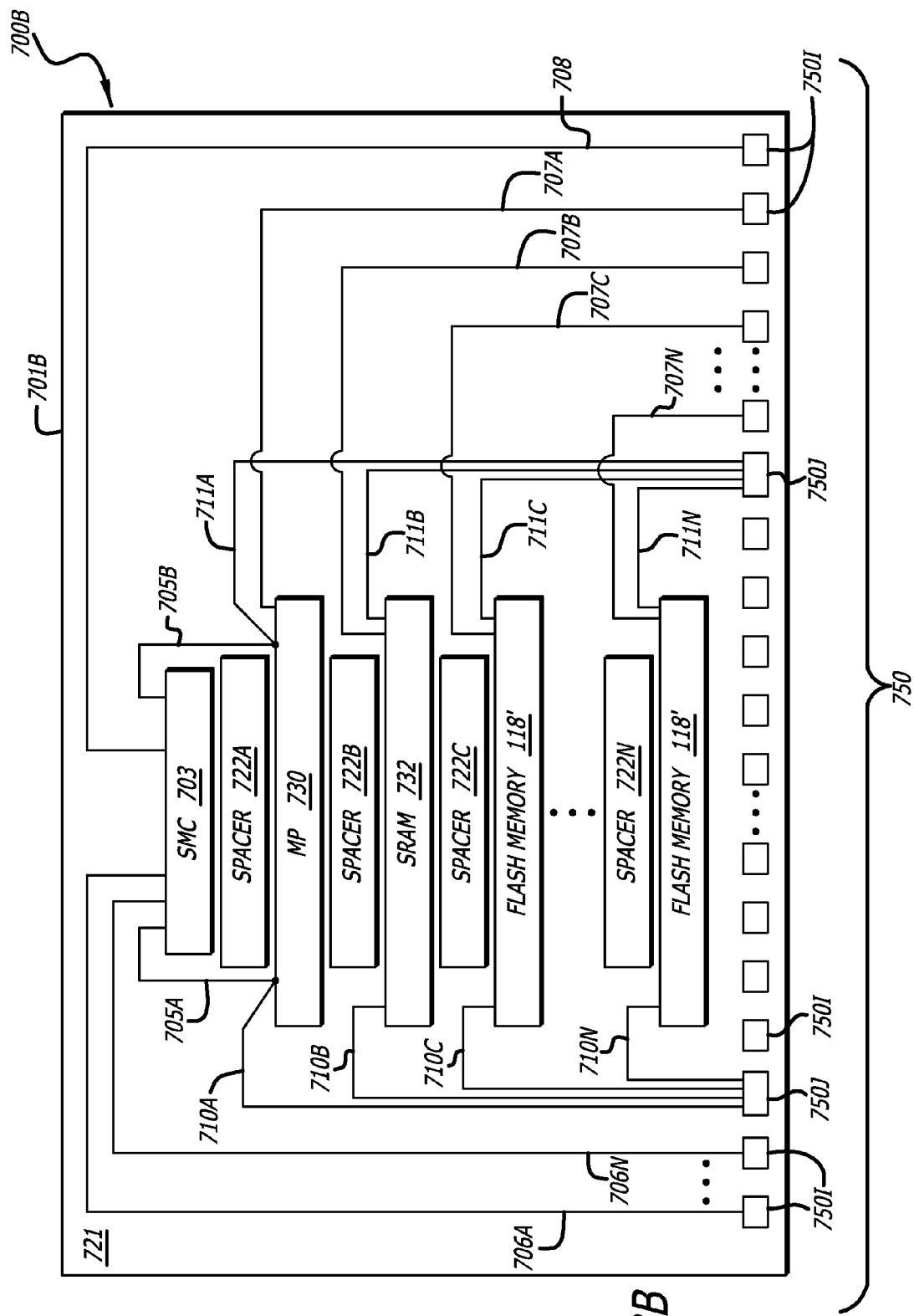

FIG. 13B is a side cutaway view of a second multi-chip package for a memory slice.

DETAILED DESCRIPTION

In the following detailed description, numerous examples of specific implementations are set forth. However, implementations may include configurations that include less than all of the alternatives for the detailed features and combinations set forth in these examples.

Introduction

Certain software applications require data to be processed from various different locations in memory. Oftentimes, the desired data is spread across different memory modules in different locations within a memory channel. To make efficient use of the memory bandwidth, new memory modules may be plugged into standard memory sockets to form memory slices in each memory channel. A master memory controller coupled to the new memory modules with the memory slices can provide a two-dimensional (2D) memory array transparent to pre-existing processors. In some embodiments of the invention, the new memory modules may include read-writeable non-volatile memory devices. With non-volatile memory devices representing linearly addressable sub-regions within a two-dimensional memory array, bad blocks of memory within the non-volatile memory devices may be mapped out. Additionally, data may be more efficiently transferred over the memory channel bus with data being arranged within the memory slices.

Computer Systems with Two-Dimensional Memory

Figure 1:
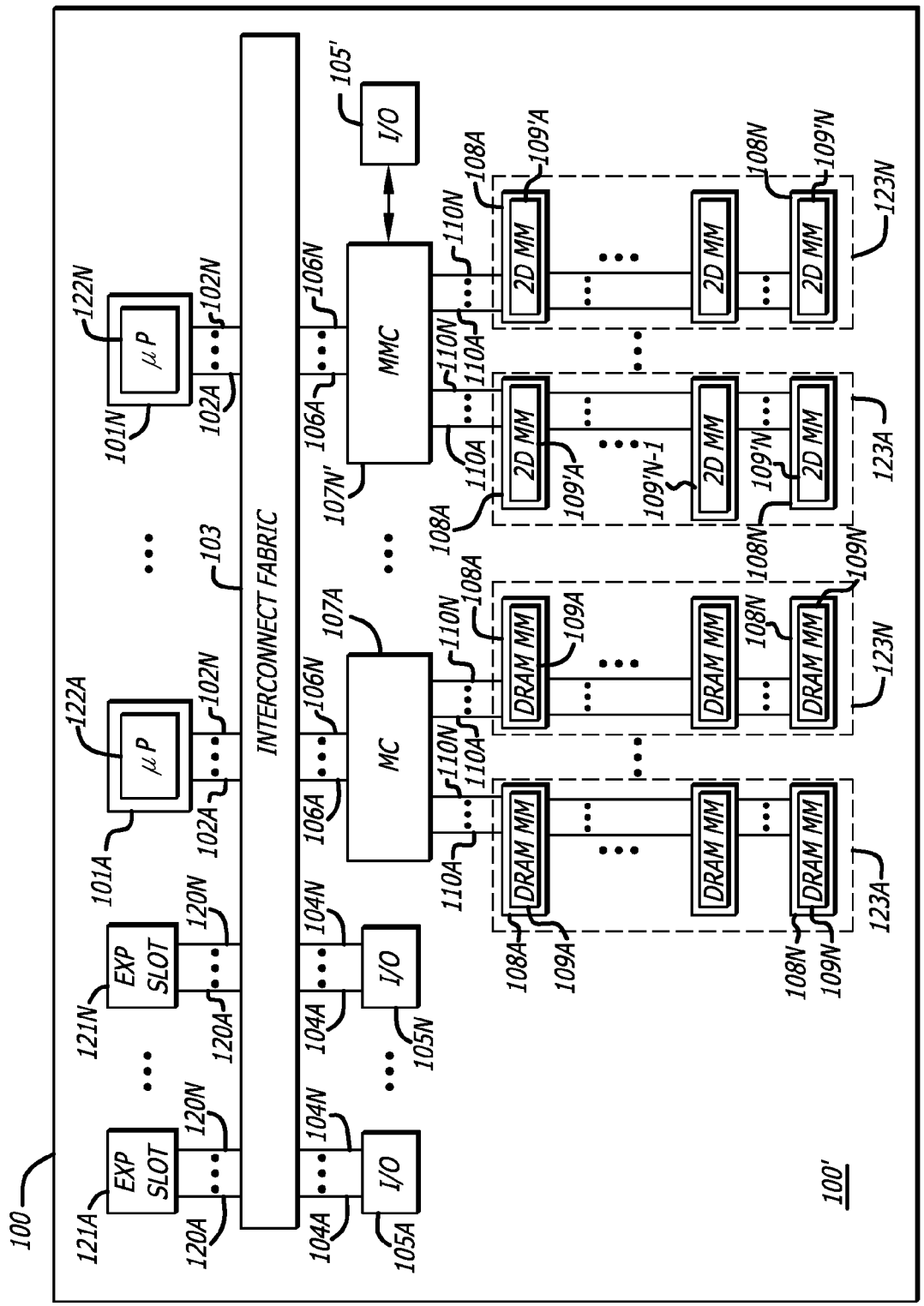
FIG. 1 is a functional block diagram of a first computer system upgraded to include a two-dimensional (2D) memory array.

Referring now to FIG. 1, a functional block diagram of a computer system 100 with a main memory is illustrated. The computer system 100 includes a multiprocessor motherboard 100'. Mounted to the mother-board 100' is a plurality of processor sockets 101A-101N. Processors 122A-122N may be inserted into the processor sockets 101A-101N. The processor sockets 101A-101N are connected to the interconnect fabric 103 via traces 102A-102N. The interconnect fabric 103 may consist of just traces or it may contain other integrated circuits (interconnect fabric logic). The interconnect fabric 103 connects the various processors, memory, and I/O together within the mother-board 100. Portions of the interconnect fabric logic may be embedded within the processors and memory controllers. Mounted to the mother-board 100' are one or more master memory controllers 107A and one or more master memory controllers 107N' each being coupled to the interconnect fabric 103 via traces 106A-106N. Printed circuit board traces 110A-110N in each of the memory channels 123A-123N are coupled between the memory module sockets 108A-108N and the respective one or more memory controllers 107A, 107N'. The memory module sockets may have proprietary pinouts or may be any one of the standard JEDEC pinouts (e.g., DDR2, DDR3, or other memory specification).

The main memory includes a two-dimensional memory array. The two-dimensional memory array may have been added to the computer system as an expansion or an upgrade to pre-existing memory channels. Alternatively, the two-dimensional memory array may be an original design and manufacture—the two-dimensional memory array may be soldered to the motherboard or plugged into sockets.

The two-dimensional memory array includes a master memory controller 107N' and a plurality of two-dimensional memory modules 109A'-109N' plugged into memory module sockets 108A-108N in each of the memory channels 123A-123N coupled to the master memory controller 107N'. A main memory with a two-dimensional memory array may also be referred to as a two-dimensional main memory.

Memory accesses into a two-dimensional memory array are different. The memory in a two-dimensional memory array is organized into memory rank rows and memory slice columns over two-dimensional memory modules. Over a plurality of memory channels, a master memory controller can randomly access memory in a plurality of memory slices in a memory rank row of a given memory module of the two-dimensional memory array at the same time as accessing another memory rank row of other memory slices in a different memory module in the array. Over the same memory channel, a memory request issued from the master memory controller as part of a compound memory request onto the memory channel, targets a given memory rank of memory within a two-dimensional memory module such that within that given memory rank multiple memory slices of memory can be concurrently accessed as part of the same memory request. The master memory controller can aggregate multiple random accesses together as one compound memory request so that a plurality of memory requests can be accessed as part of the same transaction from the master memory controller. That is, a group of addresses are concurrently used together as one memory transaction (e.g., read, write, etc.) into the main memory. The memory transactions issued over a given memory channel are split transactions. The initiation of the transaction (e.g., sending the address/control for a read) is a separate function from the completion (e.g., receiving the data corresponding to the read) of the transaction. This allows the master memory controller to concurrently initiate a plurality of memory transactions within a single memory channel and have the transaction completion be outstanding against a plurality of memory ranks.

The two-dimensional memory modules 109A'-109N' may be read-writeable non-volatile memory dual-inline-memory modules (NVM DIMMs), for example. In some implementations, the two-dimensional memory modules 109A'-109N' are designed to meet some or all of the DDR2 memory module specification (or DDR3 or other memory specification).

Additionally mounted to the mother-board 100' are one or more I/O subsystems 105A-105N that are connected to the interconnect fabric 103 via traces 104A-104N. Alternatively or conjunctively, one or more I/O subsystems 105' may be mounted to the mother-board 100' and coupled to one or more of the memory controllers 107A or to one or more of the master memory controllers 107N' to provide access to I/O devices by the processors.

Figure 2:
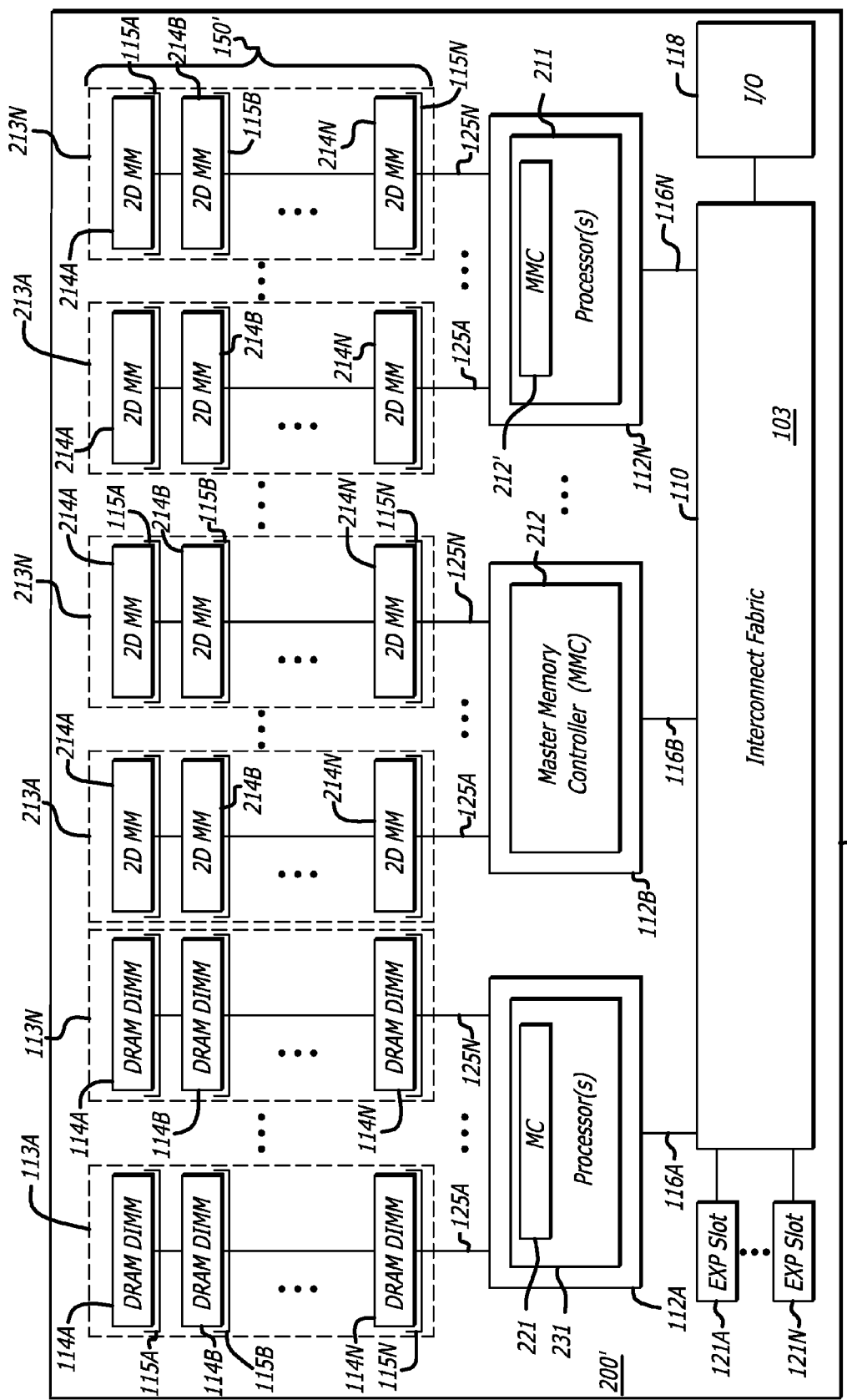
FIG. 2 is a functional block diagram of another computer system upgraded to include a two-dimensional memory array.

Referring now to FIG. 2, an alternate multiprocessor system 200 and mother-board 200' is illustrated. In FIG. 2, the master memory controller may be a pluggable master memory controller 212 to plug into a socket or it may be an integrated master memory controller 212' co-packaged in the processor package as part of a processor 211. The processor 211 includes the integrated master memory controller 212'. That is, the processor package 211 contains both the processor element and the integrated master memory controller 212'. There may be one or more master memory controllers within one processor package.

The pluggable master memory controller 212 may be plugged into a processor socket 112B. Plugging the master memory controller 212 into an open processor socket allows expansion and may upgrade a pre-existing memory channel to support a two-dimensional memory array with two-dimension memory modules.

A main memory 150' may include a mixture of conventional memory arrays and two-dimensional memory arrays. In the multiprocessor system 200, processor sockets 112A-112N are connected to the interconnect fabric 103 via the traces 116A-116N of the motherboard 200'. The processor sockets 112A-112N are also connected to the memory channels 113A-113N and 213A-213N via traces 125A-125N. Memory channels 113A-113N are conventional memory channels to control access to DRAM memory modules 114A-114N that are plugged into the sockets 115A-115N. Memory channels 213A-213N are two-dimension memory channels to control access to two-dimensional memory modules 214A-214N within each channel plugged into the sockets 115A-115N.

A master memory controller may also concurrently control two-dimensional memory modules over one or more memory channels while concurrently controlling one dimensional memory modules (e.g., DRAM memory modules or non-volatile memory modules without a slave memory controller) in other memory channels. Alternatively, a master memory controller may also concurrently control two-dimensional memory modules over a memory channel while concurrently controlling one dimensional memory modules (e.g., DRAM memory modules or non-volatile memory modules without a slave memory controller) over the same memory channel. That is, the same memory channel bus may be shared by two-dimensional memory modules and one dimensional memory modules. In this case, the master memory controller is adaptive with address/data signals being multiplexed to the different memory modules over the same memory channel bus formed of a plurality of traces (e.g. traces 125N).

In FIG. 2, the pluggable master memory controller 212, the processor 211 with the internal master memory controller 212', and the two-dimensional memory modules are plugged into sockets in order to couple to the mother board of the system. The master memory controller (MMC) and the two-dimensional memory modules (2DMM) may be coupled to the mother boards of systems in other ways. For example, instead of being plugged into sockets, the master memory controller (MMC) integrated circuit and the integrated circuits of the two-dimensional memory modules (2DMM) may be directly soldered onto the motherboard traces.

One or more expansion connectors or slots 121A-121N may also be used to upgrade the systems 100, 200 so that more memory capacity is available, power consumption may be reduced, or memory bandwidth may be improved in the main memory of the computer system. In some implementations, the one or more expansion connectors or slots 121A-121N may be used to upgrade and expand the main memory of the mother-board 100',200'. A daughter card or expansion board (not shown) may be used to upgrade the main memory in the computer systems. The daughter card or expansion board may include a master memory controller to control access to two-dimensional memory modules in each channel.

Two-Dimensional Main Memory

Figure 3:
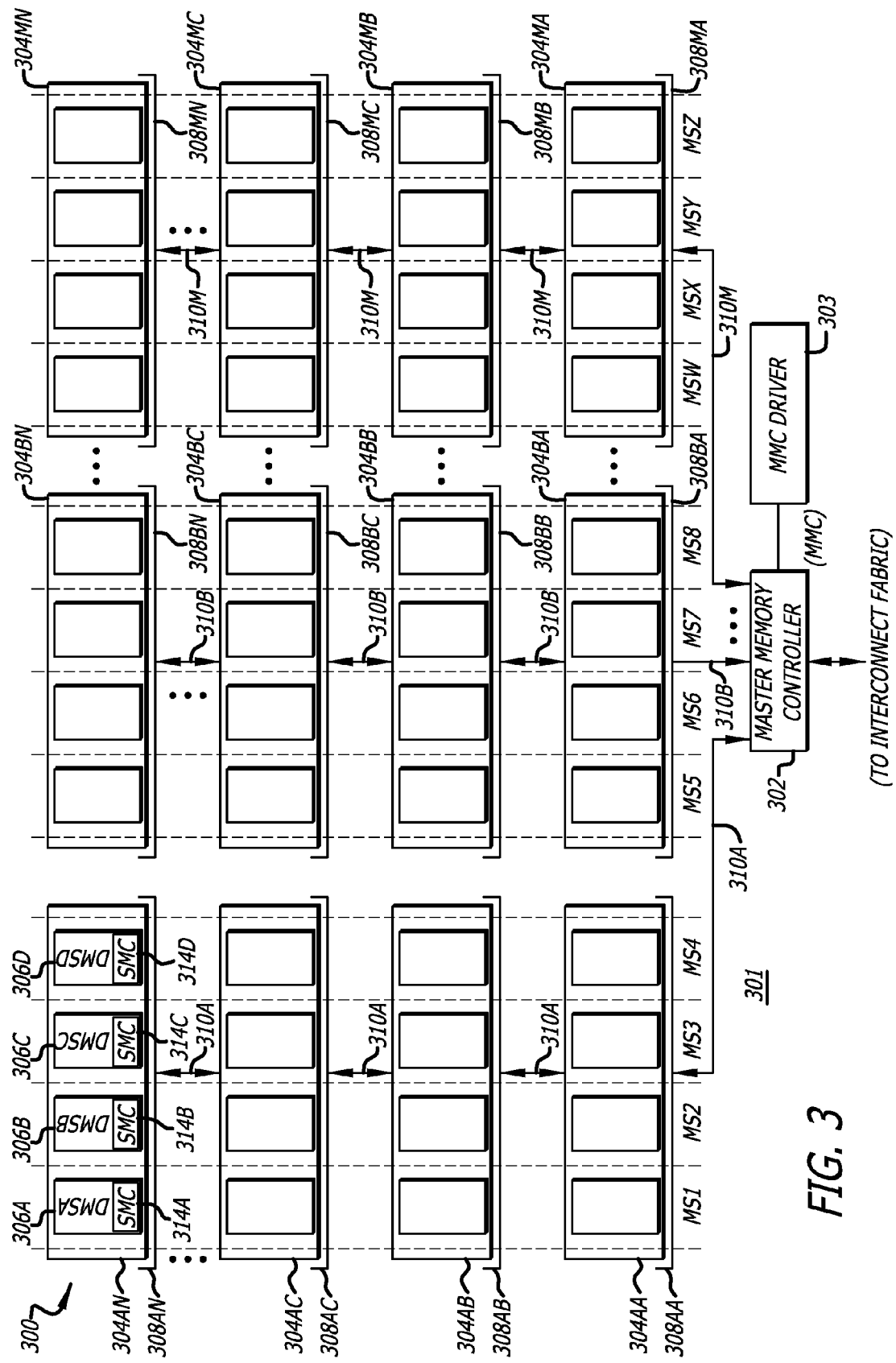
FIG. 3 is a functional block diagram of a two-dimensional memory array.

Referring now to FIG. 3, a two-dimensional main memory 300 is illustrated. The two-dimensional main memory 300 includes a two-dimensional (M by N) array of two-dimensional memory modules 304AA through 304MN, for example, plugged into an (M by N) array of memory module sockets 308AA through 308MN mounted to a printed circuit board 301. The two-dimensional main memory 300 may have the collection of two-dimensional memory modules arranged in M memory channels with each memory channel including N two-dimensional memory modules.

The two-dimensional main memory 300 further includes a master memory controller 302 coupled to memory channel buses 310A-310M of the memory channels. The memory channel buses 310A-310M couple the master memory controller to each memory module socket in the array of memory module sockets 308AA-308MN and the two-dimensional memory modules 304AA-304MN that are coupled thereto.

The two-dimensional main memory 300 includes a plurality of memory slices MS1-MSZ that are accessible concurrently in parallel. Memory in the same row across the memory channels 310A-310M and memory slices in the two-dimensional main memory 300 may be referred to as a rank of memory. The memory in each 2D memory module may be organized into one or more (e.g., two—rank 0 and rank 1) ranks of memory.

The overall address space of the 2D main memory 300 may be divided up among the ranks of memory. For a 2D main memory with two ranks of memory, rank 0 may have a first contiguous set of addresses and rank 1 may have a second contiguous set of addresses. Addresses to rank 1 memory may be higher than addresses to rank 0 memory. Alternatively, the address ordering may be reversed and address to rank 0 memory may be higher than addresses to rank 1 memory.

Within a given rank of memory, the addresses may be spread out such that each memory slice in the same rank has a contiguous set of linear addresses. For example, a first memory slice MS1 in a given rank of memory may have a contiguous set of addresses that (from the perspective of application software) are all lower than the contiguous set of addresses for a second memory slice MS2 in the same rank of memory. That is, the memory space within each memory slice may be linearly accessible. However, addressing memory across ranks of memory may or may not be linear within the corresponding memory devices of a given memory slice.

The master memory controller 302 can have multiple rank level memory transactions (e.g., read, write, etc.) outstanding into the 2D main memory. The number of outstanding rank level memory transactions may be limited by the number of ranks and the internal resources of each rank. Each rank-level memory transaction can bundle together memory access requests to the same or different locations in one or more memory slices making up the rank.

As mentioned herein, memory requests into the 2D memory array are grouped together to increase memory bandwidth efficiency. For example, a block of memory in a rank of memory on memory module 304AN in memory slice MS1 may be accessed with a given single compound memory request. Concurrently, a block of the memory in the same rank of memory on memory module 304MN in memory slice MSZ may be accessed with the same given single compound memory request. However, the master memory controller may have a plurality of outstanding compound memory requests, one or more compound memory requests per rank.

The master memory controller 302 may be a pre-existing memory controller updated with a master memory controller software driver 303 to include aspects and functionality of the master memory controller described herein. Otherwise, the master memory controller 302 may be a new hardware design that is plugged into a memory controller socket or a replacement for a processor in a processor socket.

Each memory module, such as memory module 304AN, includes memory assigned to a plurality of memory module slices 306A-306D and a respective slave memory controller 314A-314D coupled to the memory in each memory module slice. The slave memory controller 314A-314D linearly accesses the memory of the memory module in its associated memory slice. If a bad block of memory is detected, the respective slave memory controller 314A-314D can remap the physical memory address in its given memory slice to a logic memory address (See FIG. 11 for example) to avoid the bad blocks in the memory. The master memory controller 302 may be used instead to remap the physical memory addresses of memory slices into logical memory addresses to avoid bad blocks in the memory within each memory slice.

Two-Dimenstional Memory Modules

Figure 4A:
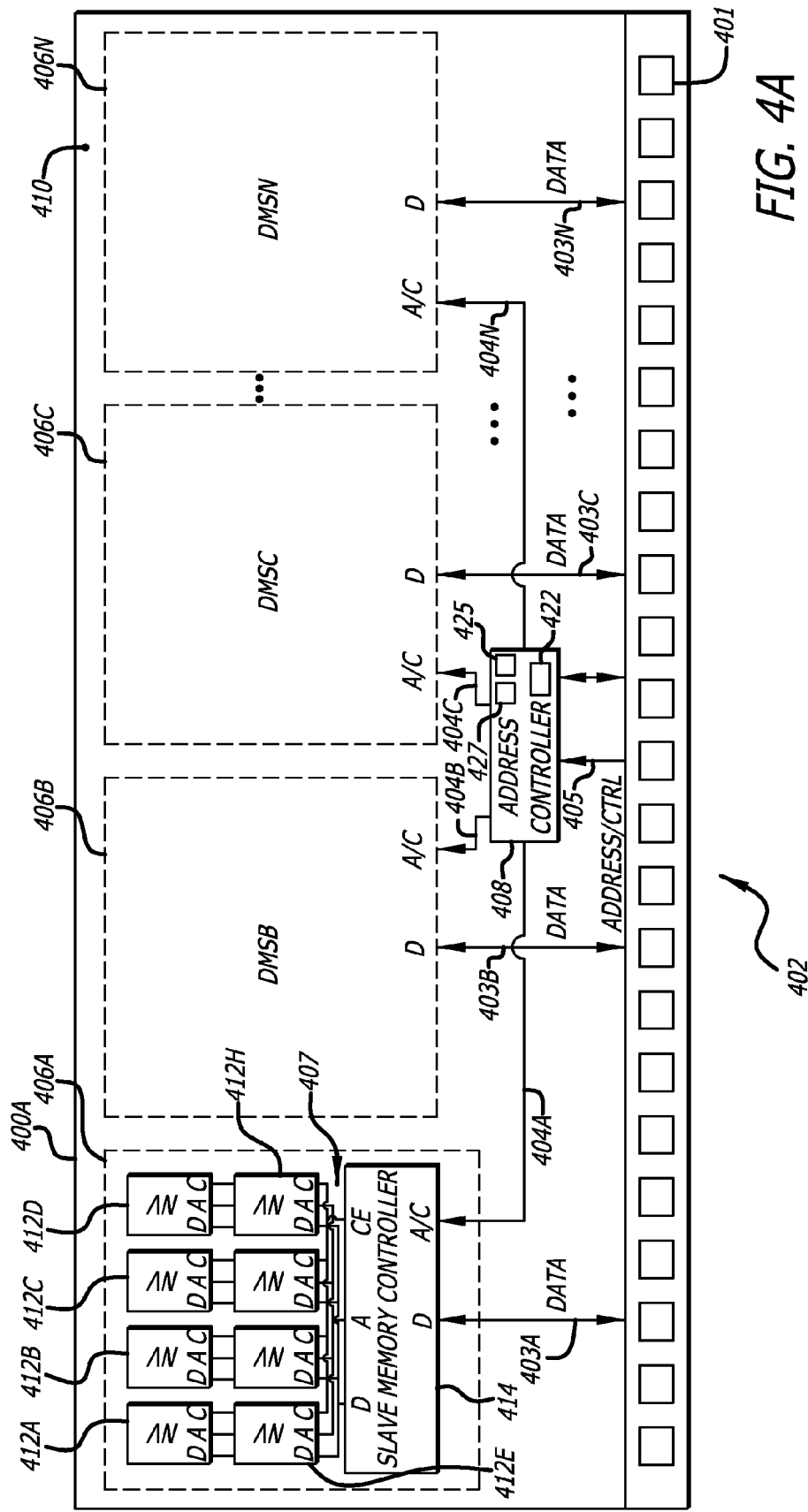
FIG. 4A is a functional block diagram of a two-dimensional memory module.

Referring now to FIG. 4A, a block diagram of a two-dimensional memory module (2DMM) 400A is illustrated. The two-dimensional memory module 400A may be one instance of the plurality of memory modules 304AA-304AN illustrated in FIG. 3 plugged into the memory module sockets in the two-dimensional memory array 300.

The two-dimensional memory module 400A includes a printed circuit board (PCB) 410 having pads 401 of an edge connector 402 (on each side for a DIMM) formed thereon. The integrated circuits may be mounted to the printed circuit board 410 and coupled together by interconnection traces or wires. The printed circuit board (PCB) 410 may have a low profile memory module form factor (e.g., height of approximately 30 millimeters (mm) high and a width of approximately 133 mm) to be plugged into sockets without taking up much space.

The two-dimensional memory module 400A includes memory assigned to a plurality of memory slices 406A-406N. Each memory slice is coupled to the pads 401 of the edge connector 402 to read and write data and to an address controller 408 to receive address signals and control signals. The address controller 408 is coupled to the pads 401 of the edge connector 402 to receive address signals and control signals from the master memory controller.

Each memory slice includes one or more memory integrated circuits 412A-412H and a slave memory controller (SMC) 414 coupled together by traces on the printed circuit board 410. The slave memory controller generates a chip enable signal CE for each of the one or more of the memory integrated circuits 412A-412H to selectively enable/disable the respective integrated circuit.

The two-dimensional memory module 400A may be a read-writeable non-volatile memory module including read-writeable non-volatile memory. In which case, one or more of the memory integrated circuits 412A-412H in each memory channel may be read-writeable nonvolatile memory devices, such as NAND-gate or NOR-gate flash electrically erasable programmable read only memory (EEPROM) integrated circuits in accordance with some implementations. Alternatively, a two-dimensional memory module may have a different memory type (e.g., SRAM, DRAM, or NON-VOLATILE MEMORY) coupled to the slave memory controller 414. That is, the one or more memory integrated circuits 412A-412H in each memory slice may be various types of integrated circuit (IC) memory devices, such as static random access memory (SRAM), dynamic random access memory (DRAM), NAND or NOR electrically erasable programmable read only memory (EEPROM). The slave memory controller may adapt to the different access characteristics of the various types of IC memory devices.

The type of memory is typically the same in a given 2D memory module. However, the type of memory may vary from 2D memory module to 2D memory module within the same memory channel. For example, coupled to the same memory channel may be a 2D memory module with NOR-gate flash electrically erasable programmable read only memory (EEPROM) integrated circuits, a 2D memory module with NAND-gate flash electrically erasable programmable read only memory (EEPROM) integrated circuits, and a 2D memory module with dynamic random access memory (DRAM) integrated circuits each of which have different startup and per byte read/write latencies. Thus, the memory channels in a 2D main memory may be heterogeneous memory channels having different types of 2D memory modules and the master memory controller may be a programmable heterogeneous master memory controller.

The memory module 400A further includes a plurality of printed circuit board traces (e.g., printed wires) 403A-403N, 404A-404N, 405, 407 for data (D), address (A), and control (C) signals formed on the PCB 410. The PCB traces 403A-403N for data (D) signals couple between the slave memory controller 414 of each the memory slices 406A-406N and respective data pads 401 of the edge connector 401. The PCB traces 404A-404N for address/control signals couple between the slave memory controller 414 of each of the memory slices 406A-406N and the address controller 408. The PCB traces 405 for address/control signals couple between the address controller 408 and pads 401 of the edge connector 401. The PCB traces 407 in each memory slice for data (D), address (A), and control (C) signals couple between the slave memory controller 414 and the one or more of the memory integrated circuits 412A-412H. Additional PCB traces may be used to couple between other integrated circuits. The PCB traces may be one or more PCB traces bundled together, such as a bus. For example, the PCB traces 405 are a plurality of traces of an address/control bus.

Figure 4B:
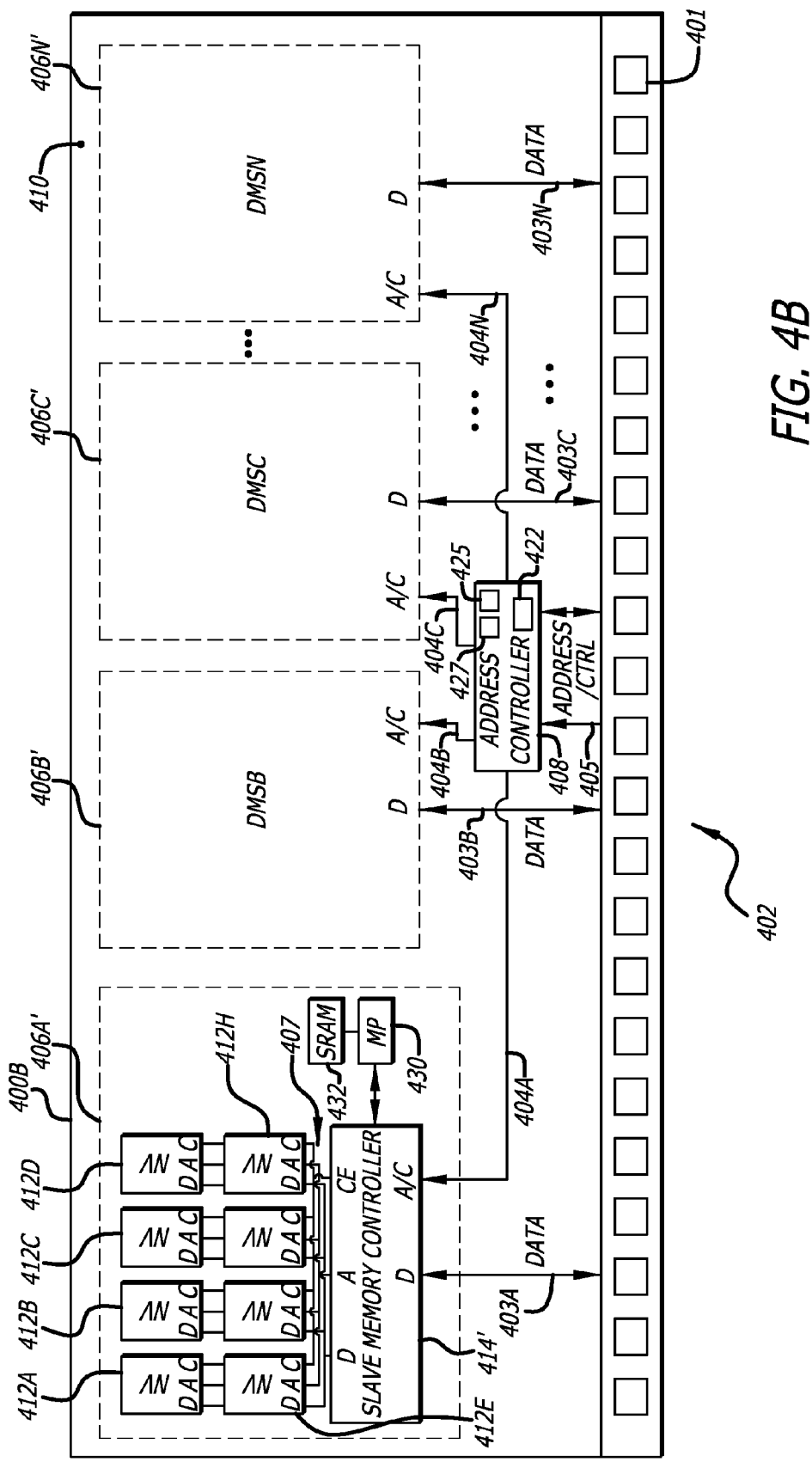
FIG. 4B is a functional block diagram of an intelligent two-dimensional memory module.

Referring now to FIG. 4B, a block diagram of an intelligent two-dimensional memory module (I2DMM) 400B is illustrated. The intelligent two-dimensional memory module 400B may be one instance of the plurality of memory modules 304AA-304AN illustrated in FIG. 3 plugged into the memory module sockets in the two-dimensional memory array 300.

The intelligent two-dimensional memory module 400B includes elements with the same reference numbers of the two-dimensional memory module 400A which are incorporated here by reference. However, the intelligent two-dimensional memory module 400B has one or more processor memory slices 406A'-406N' that further includes in each memory slice, a microprocessor 430 coupled to the slave memory controller 414 and a scratch pad memory 432. The scratch pad memory 432 is a random access memory (RAM) to store data, instructions, and other information. The processors 122A-122N of FIG. 1 and the processors 211,231 of FIG. 2 may also be referred to herein as a main or system processor and the microprocessor 430 may also be referred to herein as a memory slice processor to distinguish their locations.

The microprocessor 430 with its scratch pad memory 432 can be programmed to manipulate the data in the one or more memory integrated circuits 412A-412H, independently from the main processors 122A-122N, 112A,112N that may be in the computer system 100,200. Moreover, the microprocessor 430 in each memory slice is autonomous and may independently execute instructions for operations within the respective memory slice. Alternatively, the microprocessor 430 in each memory slice may concurrently execute the same operations for each respective memory slice in response to one or more broadcast instructions to each microprocessor.

Consider for example, a database or a portion thereof that may be stored in the two-dimensional memory array 300. The master memory controller may request a search be made in the database to each microprocessor 430 in each memory slice on each memory module with a broadcast search instruction. In response to the broadcast search instruction, each microprocessor 430 in the two-dimensional memory array 300 may search the portion of the data base stored into the memory of the memory integrated circuits in its memory slice. To do so, the microprocessor 430 may directly access the memory in the respective memory slice through the slave memory controller. The results of the search by each microprocessor 430 can be reported back to the master memory controller.

Various combinations of the microprocessor 430, the scratch pad memory 432 and the slave memory controller may be selectively integrated together into one integrated circuit die. For example, the microprocessor 430 and the slave memory controller may be integrated together into one integrated circuit die and couple to an external scratch pad memory 432. Alternatively, the microprocessor 430, the scratch pad memory 432 and the slave memory controller may be integrated into one integrated circuit die.

In some implementations, the memory modules 400A-400B are dual in-line memory modules (DIMM) and the printed circuit board (PCB) 410 is a DIMM PCB with integrated circuits and pads of edge connectors on both front and back sides. The DIMM and the DIMM socket each may have a pinout that is a Joint Electron Device Engineering Council (JEDEC) standard type such as DDR, DDR2 or DDR3. While memory slices are illustrated on a front side of the memory modules 400A-400B, additional memory slices may also be included on the back side of the memory module and its printed circuit board (PCB).

The main memory of a mother-board, such as motherboard 100 of FIG. 1, may be upgraded to swap out DRAM memory modules with the two-dimensional memory modules 400A-400B in a memory channel to improve memory data bandwidth in a computer system. In this case, two-dimensional memory modules 400A-400B are plugged into the one or more sockets 108A-108N replacing DRAM memory modules in the respective memory channel. A master memory controller may be plugged into one or more sockets 107A-107N, 112B or an integrated master memory controller may be included in a microprocessor and plugged into a processor socket 112N. The master memory controller may be a pre-existing memory controller updated with a master memory controller software driver to include aspects and functionality of the master memory controller described herein or a new hardware design of a master memory controller.

The 2D memory modules 400A-400B may both support a plurality of different types of memory integrated circuits 412A-412H through the address controller 408. The address controller 408 may include a bidirectional communication port 422, a status register 425, and a memory module identification (MMID) 427. The memory module identification (MMID) 410 provides an identification as to the type of 2D memory module and information regarding the memory integrated circuits 412A-412H mounted on the PCB 410. A plurality of signal lines form the bidirectional communication port 422 over which status from the status register 425 and the memory module identification (MMID) 427 may be communicated from each memory module to a programmable heterogeneous master memory controller. The status register 425 may store status information regarding the operation of the memory integrated circuits 412A-412H that may be polled (requested) and communicated to the memory controller through the communication port 422. A status signal may be communicated from the status register 425 over the communication port 422 to the memory controller to alleviate the non-deterministic nature of the write operations in a read-writeable non-volatile 2D memory module. The function of the communication port 422, the status register 425, the memory module identification (MMID) 427, and the status signal are also described in U.S. patent application Ser. No. 11/864,763, entitled SYSTEMS AND APPARATUS WITH PROGRAMMABLE MEMORY CONTROL FOR HETEROGENEOUS MAIN MEMORY, filed by Kenneth Alan Okin et al. on Sep. 28, 2007, which is incorporated herein by reference.

Slave Memory Controller

Figure 5:
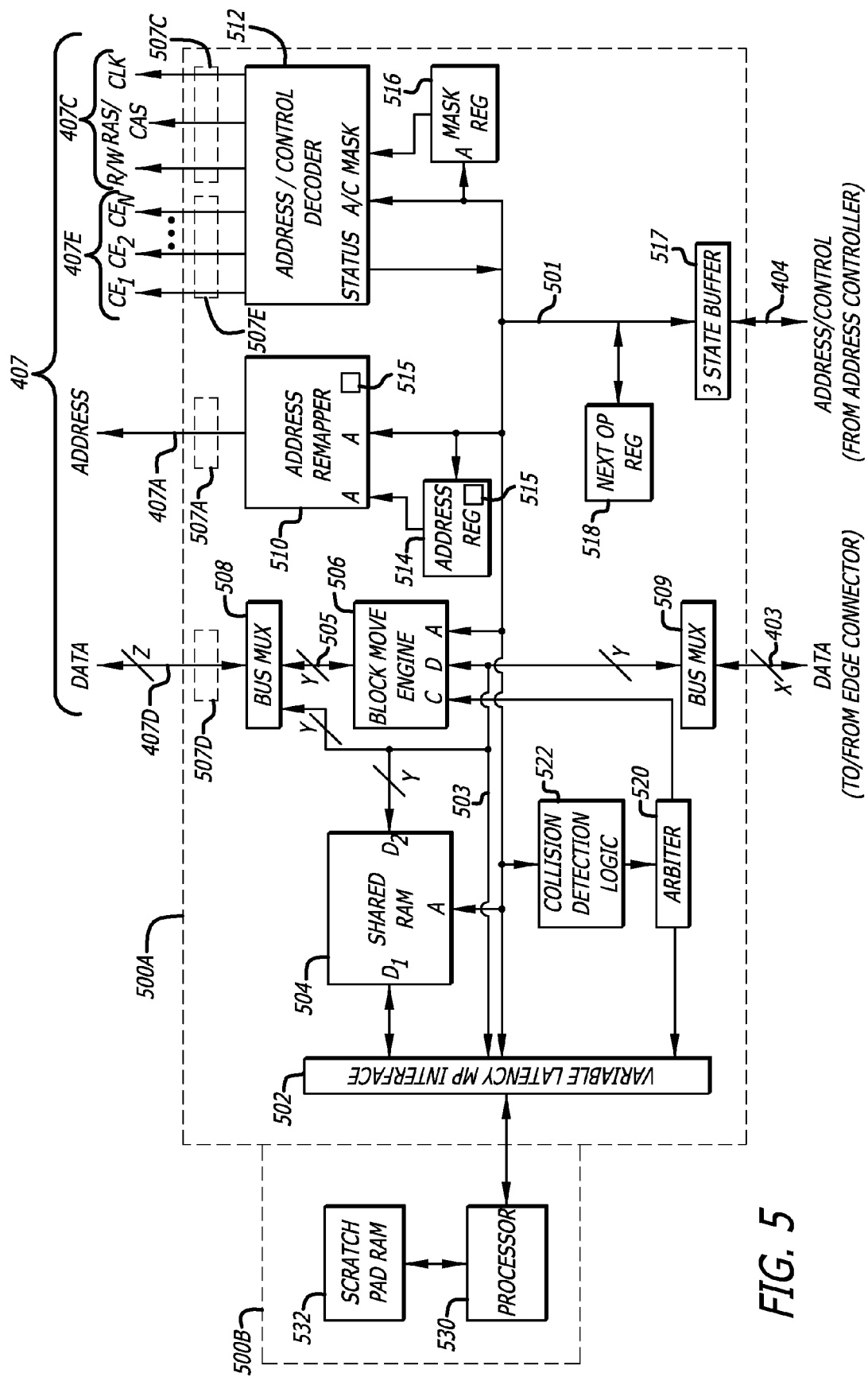
FIG. 5 is a functional block diagram of slave memory controllers.

Referring now to FIG. 5, a functional block diagram of a slave memory controller integrated circuit 500A,500B is illustrated. The slave memory controller integrated circuit 500A may include a microprocessor interface 502, a shared memory 504, a block move engine 506, a first bus multiplexer 508, a second bus multiplexer 509, an address remapper 510, an address/control decoder 512, an address register 514, a mask register 516, a three-state buffer 517, a next operation register 518, an arbiter 520, and a collision detector 522 coupled together as shown.

The memory 412A-412H coupled to the slave memory controller 500A may operate with different logic level voltages than that of the edge connector 401 of the memory module. If the slave memory controller operates substantially with the logic level voltages of the edge connector, the slave memory controller integrated circuit 500A may further include logic level voltage translators 507D, 507A, 507E, and 507C at the interface to the printed circuit board traces 407. The logic level voltage translators 507D, 507A, 507E, and 507C translate logic level voltages between memory 412A-412H operating with a first power supply voltage and the edge connector operating with a second power supply voltage different from the first. The logic level voltage translators 507D, 507A, 507E, and 507C may operate with both the first power supply voltage and the second power supply voltage. The logic level voltage translator 507D is a bidirectional logic level voltage translator. If the slave memory controller operates substantially with the logic level voltages of the memory 412A-412H instead, a bidirectional logic level voltage translator may be positioned instead at the interface to the edge connector before the bus multiplexer 509.

The microprocessor interface 502 may be a variable latency processor interface that couples to a processor 530. The processor 530 is coupled to a scratch pad memory 532. The microprocessor interface 502 may include a bidirectional buffer to adapt to changes in the delay/latency of read and/or write times of data with the shared memory 504, the memory 412A-412H, or other devices. The scratch pad memory 532 is a random access memory (RAM) to store data, instructions, and other information.

The slave memory controller integrated circuit 500A is an instance of the slave memory controller 414' illustrated in FIG. 4B that couples to a processor. However, if the slave memory controller integrated circuit is an instance of the slave memory controller 414 without a processor coupled thereto, the slave memory controller integrated circuit 500A may be simplified to exclude the microprocessor interface 502, the arbiter 520, and the collision detector 522.

The slave memory controller integrated circuit 500B includes elements of the slave memory controller integrated circuit 500A and further includes the processor 530 and scratch pad memory 532 integrated in the same die and coupled together as shown. Otherwise the description and function of the common elements herein is applicable to both the slave memory controller integrated circuit 500B and the slave memory controller integrated circuit 500A. In an alternate embodiment of the invention, the slave memory controller integrated circuit includes elements of the slave memory controller integrated circuit 500A and further includes the processor 530 integrated in the same die but with an external scratch pad memory.

The slave memory controller integrated circuit 500A interfaces to the one or more memory integrated circuits 412A-412H by the data bus 407D, the address bus 407A, one or more chip enable signals 407E, and one or more control signals 407C (e.g., read/write R/W, row-address-select/column-address-select RAS/CAS, clock CLK) over the printed circuit board traces 407. As mentioned previously, the slave memory controller integrated circuit 500A may adapt to the different access characteristics of various types of IC memory devices used as the one or more memory integrated circuits 412A-412H. The block move engine 506 can adapt to different read and write access times if different types of IC memory devices are used as the one or more memory integrated circuits 412A-412H.

The slave memory controller 500A interfaces to the master memory controller by the data bus 403 coupled to the edge connector by PCB traces. Indirectly, the slave memory controller 500A further interfaces to the master memory controller by way of the external address/control bus 404 from the address controller.

The shared memory 504 is a random access memory to provide temporary storage of data in a shared memory region. It may be a volatile type of memory and may be referred to herein as a volatile random access memory (VRAM). By way of the block move engine 506, the shared memory 504 allows both the processor 530 and the master memory controller to access the memory 412A-412H coupled to the slave memory controller in a given memory slice. As mentioned herein, the microprocessor interface 502 coupled to the processor 530 may be a variable latency processor interface as the read/write access to the memory 504 is shared between the processor 530 and the block move engine 506. Thus, if the block move engine 506 is accessing the shared memory, the processor interface 502 may need to wait for the access to the shared memory to complete. Moreover, the processor 530 and the block move engine 506 may try to access the shared memory 504 at the same time resulting in a collision.

The collision detection logic 522 is coupled to the arbiter 520. The collision detection logic 522 is also coupled to the address controller 408 (see FIG. 4), the variable latency microprocessor interface 502, the shared memory 504, the block move engine 506, the address remapper 510, the address/control decoder 512, the address register 514, the mask register 516, and the next operation register 518 by the address/control bus 501,404. The collision detection logic 522 is coupled to the processor interface 502 to monitor the addresses from the processor 530 into the shared memory 504. The collision detection logic 522 monitors the address/control bus 501,404 for addresses from the master memory controller for addresses into the shared memory 504 and/or the memory 412A-412H (see FIGS. 4A-4B) in the respective memory slice. If there is a concurrent address overlap into the shared memory 504, the collision detection logic 522 may signal the arbiter 520 to step in and control access to the shared memory 504. If there are concurrent operations by both of the microprocessor 530 and the master memory controller 302 (see FIG. 3) to access the memory 412A-412H (see FIGS. 4A-4B) in the respective memory slice, the collision detection logic 522 may signal the arbiter 520 to step in and control access to the memory, That is, the collision detection logic 522 may look for one or both of an address overlap and/or a temporal overlap in an access to memory. The arbiter 520 signals to the block move engine 506 or the processor 530 (through the interface 502) as to which has priority and which has to wait. The arbiter 520 may give preference to the block move engine 506 if the overlapping request for access to the shared memory 504 or the memory 412A-412H occurs at substantially the same time.

The first bus multiplexer 508 and the second bus multiplexer 509 are provided to improve the data bandwidth into and out of the block move engine 506. The bit width Y into and out of the block move engine 506 may differ from the bit width X of the data bus 403 to the edge connector and the bit width Z of the data bus 407D to the memory integrated circuits 412A-412H. For example, the bit width X may be eight (8) bits, the bit width Y may be sixteen (16) bits, and the bit width Z may be thirty-two (32) bits for each memory slice in one embodiment of the invention.

Data from the master memory controller provided on the bus 403 may be directly written into memory 412A-412H through the bus multiplexers 508-509 and the block move engine 506. The block size that may be loaded into memory may vary over a range of sizes. For example, the block size may be as small as 32 bits or as large as eight kilobytes (KB) in one embodiment of the invention. With a smaller block size, the block move engine 506 may be bypassed by the bus multiplexer selecting data bus 503 instead of data bus 505 such that bus multiplexers 508-509 are directly coupled together in a bypass access mode.

Alternatively, data from the master memory controller provided on the bus 403 may be written into the shared memory 504 through the bus multiplexer 509 and/or the block move engine 506. Later, the block move engine 506 may read the shared memory 504 and write the data into the memory 412A-412H through the bus multiplexer 508. Alternatively, data in the shared memory 504 may be read and then written into the memory 412A-412H through the bus multiplexer 508 bypassing the block move engine 506.

Likewise, data from the memory 412A-412H may be directly read out to the master memory controller through the bus multiplexers 508-509 bypassing the block move engine 506 in response to smaller data block sizes or with the assistance of the block move engine 506 in response to larger data block sizes. Alternatively, data from the memory 412A-412H may be read out into the shared memory 504 through the bus multiplexer 508 and the block move engine 506 or through the bus multiplexer 508 bypassing the block move engine 506. The master memory controller can later read out the data from the shared memory 504 through the bus multiplexer 509 and/or the block move engine 506.

While the master memory controller may access the shared memory 504 and the memory devices 412A-412H in each memory slice in various ways, each microprocessor 530 may also access the shared memory 504 and the memory devices 412A-412H in each memory slice of a respective 2D memory module in various ways.

The microprocessor 530 may write data onto the data bus 503 through the variable latency microprocessor interface 502. The data on the data bus 503 may be selectively written into the memory devices 412A-412H through the block move engine 506 and bus multiplexer 508 or directly through the bus multiplexer 508 bypassing the block move engine 506. The data on the data bus 503 from the microprocessor 530 may also be selectively written into the shared memory 504 for later processing by the block move engine 506 into the memory devices 412A-412H through the block move engine 506 and bus multiplexer 508. Alternatively, data written onto the data bus 503 through the variable latency microprocessor interface 502 by the microprocessor 530 may be read out by the master memory controller through the bus multiplexer 509. The master memory controller may also read memory locations in the shared memory 504 where the microprocessor 530 previously stored data. In this manner, the microprocessor 530 may communicate with the master memory controller.

Data on the data bus 503 may also be read by the microprocessor 530 through the variable latency microprocessor interface 502. Data may be read out from the memory devices 412A-412H onto the data bus 503 through the block move engine 506 and bus multiplexer 508 or directly through the bus multiplexer 508 bypassing the block move engine 506. Data stored in the shared memory 504, such as by the master memory controller for example, may also be read out onto the data bus 503 for reading by the microprocessor 530. Data written onto the data bus 503 through the bus multiplexer 509 by the master memory controller may also be read by the microprocessor 530. In this manner, the master memory controller may communicate with the microprocessor 530. The microprocessor 530 may store the data into the scratch pad memory 532 where it may be processed.

Access to memory 412A-412H by the master memory controller and/or microprocessor 530 through the bus multiplexer 508, the bus multiplexer-509 and/or the block move engine 506, may be selectively controlled by the address/control decoder 512. The address/control decoder 512 determines if an address on the address/control bus 501,404 is for the given memory slice of the given memory module. If the address is not for the given memory slice of the given memory module, the bus multiplexers 508-509 and the block move engine 506 may not be selectively enabled to allow access to the memory by the master memory controller and/or the microprocessor 530.

The address/control decoder 512 is coupled to the internal address/control bus 501 which is also coupled to the mask register 516, as well as other functional blocks in the slave memory controller. The internal address/control bus 501 may be selectively coupled to the external address/control bus 404 by the three state buffer 517. Thus, the address/control decoder 512 may also be coupled to the external address/control bus 404.

The mask register 516 stores address mask bits which are coupled into the address/control decoder 512. The 2D memory module and the ranks of memory therein are activated by using the memory-module/rank-select bits on the memory channel bus 310A-310M (see FIG. 3) connecting the master memory controller 302 to the 2D memory module 304AA-304MN. For those memory modules and ranks selectively activated by the select bits, the address is received by their respective address controllers 408 (see FIGS. 4A-4B) and slave memory controllers 414,414'. The address/control decoder 512 in each respective slave memory controller analyzes the mask bits (in the address or in the register 516) to determine whether or not to enable the operation in their respective memory slice.

Figure 10:
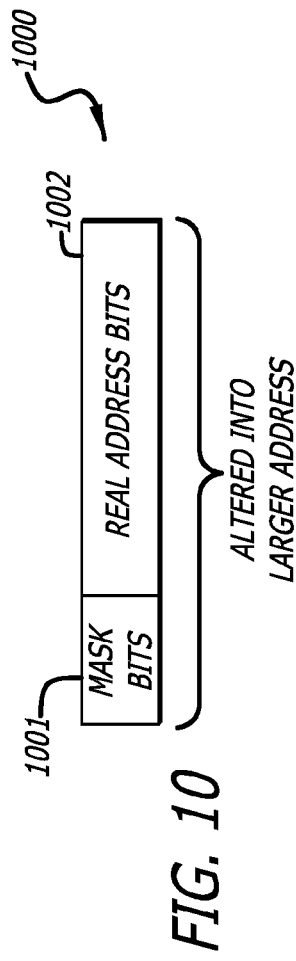
FIG. 10 is a diagram illustrating address encoding of addresses including mask bits.

Referring now momentarily to FIG. 10 and FIG. 5, an address 1000 may contain mask bits 1001 and address bits 1002. The mask bits 1001 may be used to set the address range over which the given memory 412A-412H is accessible. The mask bits 1001 alias the address bits into a larger address space. In one configuration, the mask bits 1001 may be 8 bits and the address bits may be 16 bits. Before the address 1000 is provided on the address/control bus 404,501 the address controller 408 (see FIGS. 4A-4B) of the memory module decodes the bits of the address to determine if it is for the given memory module. If so, the address 1000, including mask bits 1001 and address bits 1002, is supplied on the address/control bus 501,404 from the address controller or the next operation register 518.

There may be one mask bit for each memory slice in a two-dimensional memory array. If the address 1000 on the address/control bus 501,404 (referring generally to one of the address/control buses 404A-404N) has one or more mask bits 1001 set, one or more respective memory slices are enabled to perform a memory operation. If a mask bit in the mask bits 1001 is not set in the address 1000 on the address/control bus 501,404, the respective memory slice does not perform the operation. The address bits 1002 in the address 1000 on the address/control bus 501,404 determines which memory device 412A-412H and which memory locations are to be accessed during the memory operation.

The address/control decoder 512 decodes the mask bits 1001 and the address bits 1002 and determines which of the one or more memory circuits 412A-412H to enable by the chip enable signals 407E. The address/control decoder 512 also generates control signals 407C for the one or more memory circuits 412A-412H such as read/write (R/W) control, row address select/column address select (RAS/CAS), and/or clock strobe (CLK) for example. The address/control decoder 512 may also provide control of other circuits in the slave memory controller 500A. For example, the address/control decoder 512 may selectively enable one or more of the bus multiplexers 508-509 in the slave memory controller, such as to read or write data with the master memory controller over the data bus 403. The address/control decoder 512 may also generate status information onto the internal address/control bus 501 which may be coupled back through the three-state buffer 517 to the address controller 408 over the address/control bus 404.

A second mechanism may be used to selectively activate memory slices and decide whether or not memory slices participate in memory transactions in the two-dimensional array. Instead of mask bits on the address/control bus 404, 501, mask bits may be stored in the mask register 516 and serve as sticky mask bits for the next set of memory operations within respective 2D memory modules. The bits in the mask register 516 may be used until the bits in the mask register 516 are reset (e.g., all zeroes).

The use of the mask register 516 to control memory slice addressing is now described. The master memory controller initially performs a write operation into the control space of each slave memory controller to set each mask register 516 on each memory module. To mask the write of the mask register itself, the address-level mask bits 1001 are used. The mask register includes one or more bits (referred to as address range bits) representing one or more address ranges that may be supported by the slave memory controller. When an address range bit is set, the slave memory controller performs the operations in that address range. If an address range bit is not set, the slave memory controller does not perform operations in that address range.

Read/write operations to the address ranges are selectively acted upon by the slave memory controller in response to the settings of the one or more mask bits in the mask register 516. The master memory controller may alter the settings of the address range bits in the mask register 516. Thereafter the new settings of the address range bits govern future operations of the slave memory controller.

Figure 11:
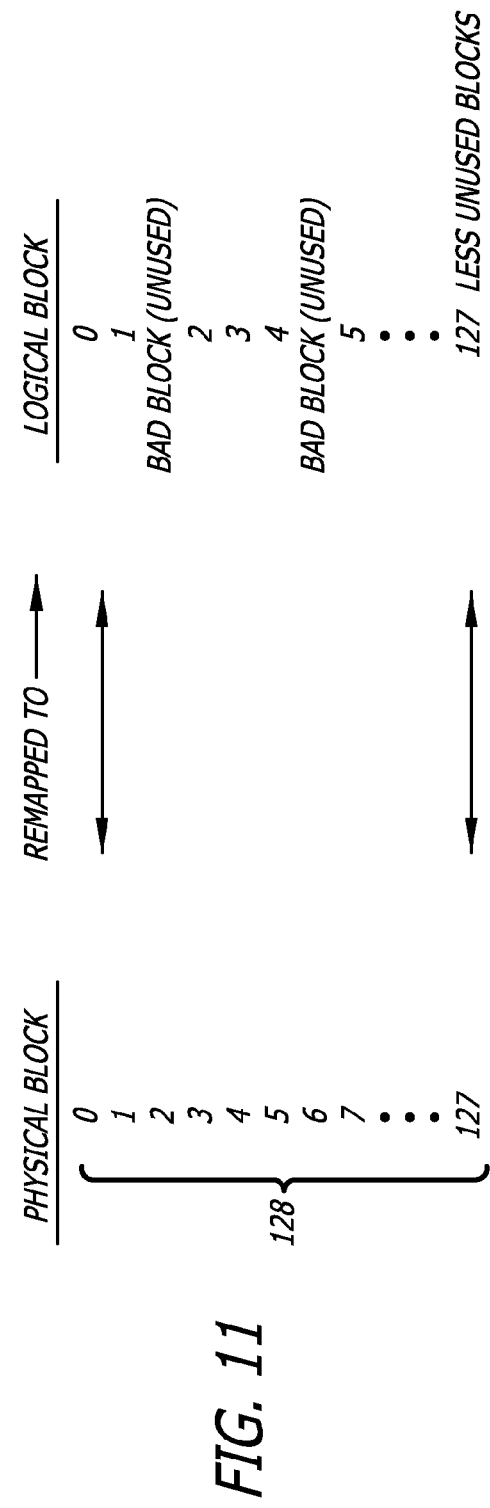
FIG. 11 is a diagram illustrating logical block remapping into physical memory blocks.

Referring now to FIG. 11 and FIG. 5, the address remapper 510 is coupled to the address/control bus 501. The address remapper 510 may receive addresses from the address controller over the external address/control bus 404 and/or from the address register 514 over the internal address/control bus 501. Generally, the address remapper 510 maps the logical address on the internal address/control bus 501 into the physical address for the memory integrated circuits 412A-412H on the address bus 407A. The logical address is a linear address range. A number of physical addresses may be skipped for various reasons, such as a bad memory block. For example in FIG. 11, physical blocks 2 and 6 are skipped and unassigned to a logical address. While a memory slice on a 2D memory module may have a number of physical blocks, the number of logical blocks that are accessible may be less. Note that in some embodiments of the invention the address remapping functionality of the address remapper may be performed by the master memory controller using hardware, software, and/or a combination thereof.

The address register 514 may be used to store a starting address for a sequence of addresses generated by the remapper 510. The address register 514 may be particularly useful for a burst access mode by the master memory controller. In this case, the address register 514 or the remapper 510 may include a loadable counter 515 that initially stores the starting address and automatically increments the starting address to generate new addresses to selectively access one or more locations in the memory over a plurality of cycles to access blocks of data for a data burst in the burst access mode.

The next operations register 518 may also contain one or more logical addresses that can be coupled into the address remapper 510 for gaining access to the memory 412A-412H. Generally, the next operations register 518 stores the next operation that is to occur with the master memory controller. The insight into the next operation may assist in setting up the next sequence of operations within the slave memory controller, including the next logical address into memory.

For the next operations register 518 to write out the next operation and address if any onto the internal address/control bus 501, the three state buffer 517 may be tri-stated into a high impedance state so that the internal bus 501 is isolated from the external address/control bus 404. Other functional blocks in the slave memory controller 500A may internally communicate address and control information between them by tri-stating the buffer 517. The buffer 517 may be selectively be turned on as an input buffer to allow address/control signals on the external address/control bus 404 to couple into the slave memory controller on the internal address control bus 501.

One or more status signals on the internal address/control bus 501 may be written out to the address controller 408 for further communication to the master memory controller. In this case, one or more bits of the three state buffer 517 may be turned on as an output buffer to allow the status signals on the internal address/control bus 501 to be written out to the external address/control bus 404. Thus, one or more bits of the three state buffer 517 may be three-state input/outputs to provide for input/output signaling.

Master Memory Controller

As discussed previously, the master memory controller may be a pre-existing memory controller updated with a master memory controller software driver to include aspects and functionality of the master memory controller described herein. Alternatively, the master memory controller may be a new hardware design. The master memory controller may be plugged into a socket or be integrated into a microprocessor as an integrated master memory controller and plugged into a processor socket.

The master memory controller may initiate various types of memory accesses in a two-dimensional memory array including a memory access transaction and a memory access operation. A memory access transaction is a logical memory access into the two-dimensional memory array that is initiated by the master memory controller; A memory access operation is a physical memory access into the two-dimensional memory array that is initiated by the master memory controller. A memory access transaction may involve one or more memory access operations. For example, a memory access operation may transfer 32 bits of data from each memory slice, while a memory access transaction may transfer an arbitrary size of data within a range, such as from 4 bytes (32 bits) to 2 kilo-bytes.

Figure 6:
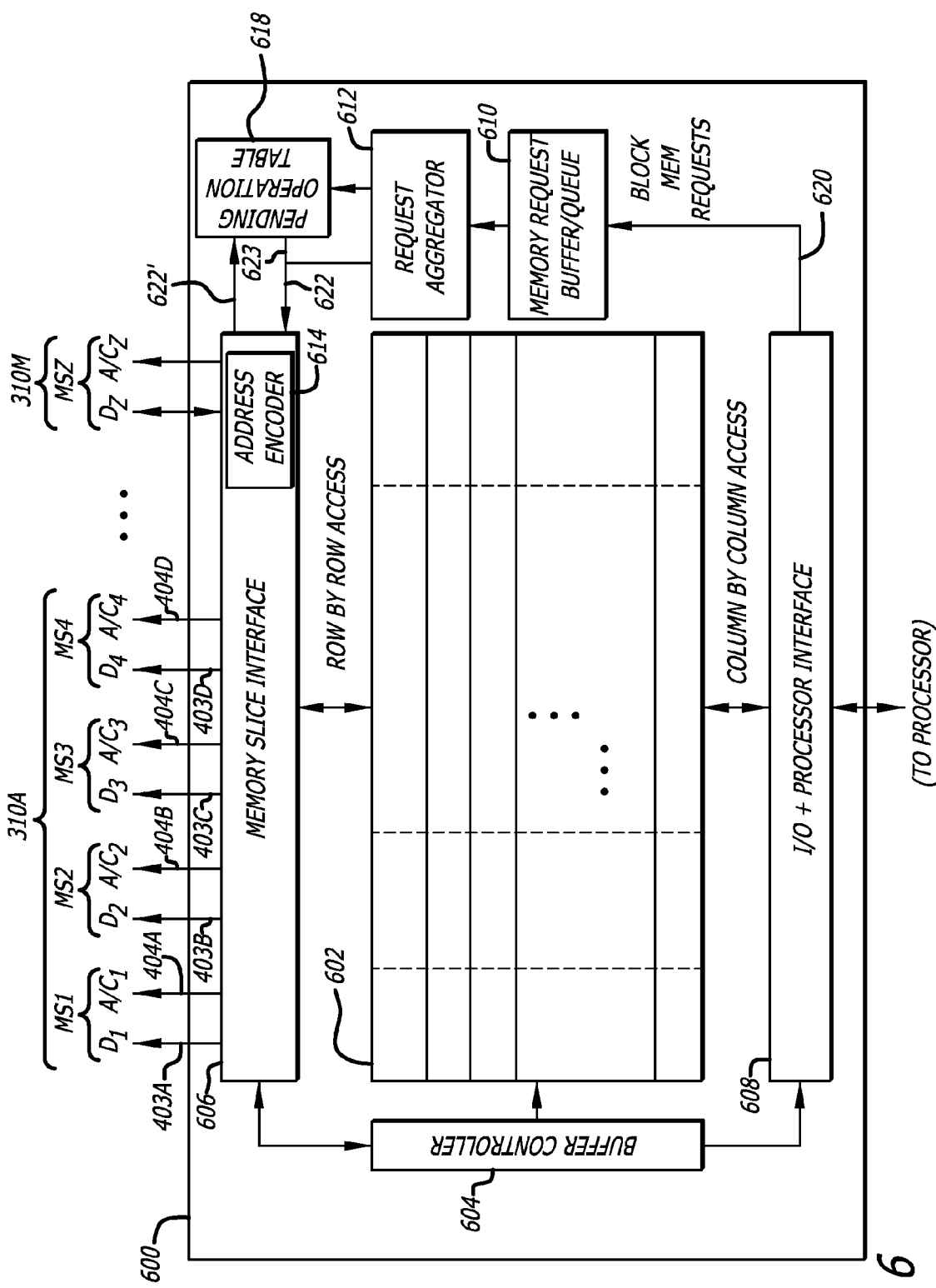
FIG. 6 is a functional block diagram of a master memory controller.

Referring now to FIG. 6, a functional block diagram of a master memory controller 600 is illustrated. The master memory controller 600 includes a two-dimensional transpositional buffer 602, a buffer controller 604, a memory slice interface 606, an I/O-processor interface 608, a memory request buffer/queue 610, a request aggregator 612, and a pending operations table 618 coupled together as shown. The master memory controller 600 may be an instance of the master memory controller 302 illustrated in FIG. 3. The memory slice interface 606 couples to and between the two-dimensional transpositional buffer 602 and the two-dimensional memory array 300, such as by buses 310A-301M illustrated in FIG. 3. The I/O-processor interface 608 couples to and between the two-dimensional transpositional buffer 602 and a processor or interconnect fabric (see FIGS. 1-2).

The buffer controller 604 is coupled to the two-dimensional transpositional buffer 602, the memory slice interface 606, and the processor interface 608 to control read/write access to the two-dimensional transpositional buffer 602. The two-dimensional transpositional buffer 602 is a two port buffer memory with different access over each port. The memory slice interface 606 accesses data in the two-dimensional transpositional buffer 602 on a row by row basis. In contrast, the processor interface 608 accesses data in the two-dimensional transpositional buffer 602 on a column by column basis. In this manner, the access to data may be transposed. That is, the memory slice interface may write data into the two-dimensional transpositional buffer 602 row by row while the processor interface 608 may read out data column by column from the two-dimensional transpositional buffer 602. Similarly, the processor interface 608 may write data into the two-dimensional transpositional buffer 602 column by column while the memory slice interface may read data out of the two-dimensional transpositional buffer 602 row by row.

Data that is written into and read from the two-dimensional transpositional buffer 602 is blocked into data blocks. A data block is a sequence of data bytes having a block size or length. The block size or block length of the data blocks may vary over a range of sizes. The size of the two-dimensional transpositional buffer 602 is variable as well in accordance with the block length or block size of the data blocks.

A request directed to a rank of memory within a two-dimensional memory module may be referred to herein as a compound memory request or a memory module request. A compound memory request is formed of block requests for individual memory slices within a given rank. A block request may also be referred to herein as a memory slice request. If the compound memory request is a read operation, the memory slice data packed together by the memory module in response to the compound memory request may be referred to herein as a compound memory response or a memory module response. The data retrieved from a memory slice in response to the block request may be referred to herein as a block response or a memory slice response.

A block request is a request for a block size or block length of data. The master memory controller can read/write data from/into the read-writeable non-volatile memory through the slave memory controller, or from/into the shared memory 504 within the slave memory controller. Accordingly, the block size may vary over a range, such as from 128 bytes to 2 kilo-bytes of information for accesses into read-writable non-volatile memory using NAND-gate EEPROM memory devices, from 32 bytes to 2 kilo-bytes of information for access into read-writable non-volatile memory using NOR-gate EEPROM memory devices, or from 4 bytes to 2 kilo-bytes of information for access into the shared memory 504 in the slave memory controller for the respective memory slice of the memory module.

The transposition buffer 602 needs to have space to store all of the data for at least one compound request. The memory space to store the data for one compound request is the resultant product of multiplying the block size and the number of memory slices in a rank together. The number of memory slices within a memory module may be 16 slices per rank, for example.

If implemented in hardware, the size of the two-dimensional transpositional buffer 602 is designed for the maximum block size expected in the range. If smaller data block sizes are to be used, the buffer controller 604 adapts the addressing of the larger two-dimensional transpositional buffer 602 to the smaller block sizes. If implemented in software, the storage table making up the two-dimensional transpositional buffer 602 is merely redefined for the smaller or larger block sizes.

The height of each column of the two-dimensional transpositional buffer 602 is at least a block size long. The row size of the two-dimensional transpositional buffer 602 may be determined by the number of bytes that can be delivered/received by a two-dimensional memory module for each memory module operation over a memory channel. The row size may vary over a range as well, such as 128 bits (16 Bytes) or 512 bits (64 Bytes), depending upon the type of memory module and the memory slice operations supported into the two dimensional memory array.

The structure and function of the master memory controller 600 allows a main or system processor (e.g., processors 122A-122n of FIG. 1 or processors 211,231 of FIG. 2) to perform memory operations into the two-dimensional memory array assuming a linear or contiguous addressing range, even though the addresses for individual memory transactions issued to each slave memory controller may be non-contiguous. The transposition of memory access provided by the master memory controller efficiently uses the available data bandwidth on each memory channel (e.g., see memory channels 310A-310M of FIG. 3) connecting a master memory controller 302 to the two-dimensional memory modules 304AA-304MN.

The memory slice interface 606 provides the bidirectional data and address/control interface to each of the plurality of memory slices MS1-MSZ in the two-dimensional memory array, such as the 2D memory array 300 illustrated in FIG. 3. The memory slice interface includes an address encoder 614 to encode addresses for read or write access to one or more memory slices of the 2D memory array.

As access into the 2D memory array is over a plurality of memory slices, a plurality of traditional memory requests are aggregated together to access the 2D memory array. Memory access requests 620 (memory read/write requests) from the processors or input/output devices received by the processor interface 608 are coupled into the memory request buffer/queue 610 for accumulation and prioritization in a queue. The memory request buffer/queue 610 may reorder the memory requests in queues to schedule them together to more efficiently use available data bandwidth over the memory channels into the two dimensional memory array.

A plurality of memory requests are coupled into the request aggregator 612 where they are aggregated together into one or more compound memory requests 622 over one or more memory slices in the 2D memory array. The compound memory requests 622 including one or more addresses are coupled into the memory slice interface 606. The memory slice interface 606 encodes the addresses with the address encoder 614 and issues the compound memory request 622 into the 2D memory array over one or more of the memory slices MS1-MSZ. If it is a write compound memory request, the memory slice interface may read data out of the two-dimensional transpositional buffer 602 row by row and write it into the 2D memory array. If it is a read compound memory request, a compound memory response including a concurrent response from every memory slice in the 2D memory array is expected by the master memory controller, even if the memory slice response is only a default known null data response providing a data fill marker for a given memory slice. The known null data response is provided when a memory slice is not active as it was not accessed by the compound memory request. This response gets written into the transpositional buffer 602 row by row, to be read out column by column using the I/O and processor interface 608 at a subsequent time.

The request aggregator 612 is coupled to the pending operations table 618 to indicate that it is ready to issue a compound memory request. The pending operations table 618 adds the compound memory requests into its table of row entries that are issued into the 2D main memory. The pending operations table 618 includes table entries each of which include the compound memory request and a tag. The tag may be the memory rank of memory to which the compound memory request is to be issued, if one compound memory request is permitted per rank. Otherwise, the tag may be a unique number assigned to the given compound memory request. The tag 623 may optionally be appended to the compound memory request 622 and issued into the 2D main memory. Completed compound memory requests 622' are coupled into the pending operations table 618. Upon completion of the compound memory requests 622', the associated table entries in the operations table are cleared. In this manner, the pending operations table 618 keeps an accounting of the status of the outstanding compound memory requests so that available data bandwidth in the memory channels of the 2D main memory is efficiently utilized.

As mentioned previously, the memory channels in a 2D main memory may be heterogeneous memory channels having different types of 2D memory modules. In this case, the master memory controller may be a heterogeneous master memory controller to support the different types of 2D memory modules in each memory channel. Thus, the master memory controller may include the functionality and/or circuits described in U.S. patent application Ser. No. 11/864,763, entitled SYSTEMS AND APPARATUS WITH PROGRAMMABLE MEMORY CONTROL FOR HETEROGENEOUS MAIN MEMORY, filed by Kenneth Alan Okin et al. on Sep. 28, 2007, which is hereby incorporated by reference.

Two-Dimensional Memory Array Operation

Figure 7:
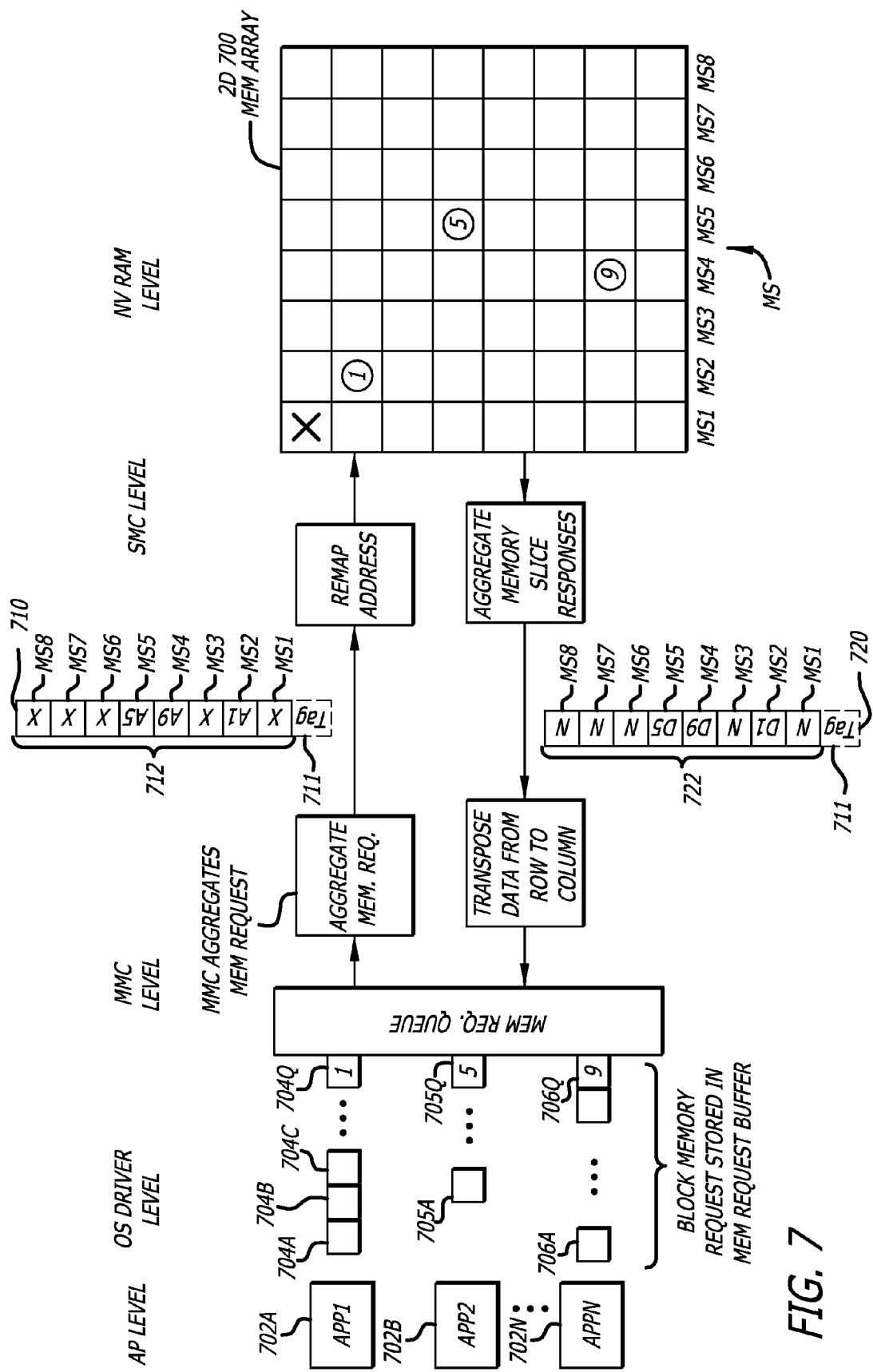
FIG. 7 is a functional block diagram illustrating the various levels or layers of operation for a two-dimensional memory array.

Referring now to FIG. 7, a diagram illustrates the overview of a read access operation into a two-dimensional memory array 700 at various system levels or layers, e.g., application level, operating system driver level, master memory controller level, slave memory controller level, and memory level. Each of these operations may be performed in software, hardware, or a combination thereof.

At the application level, one or more application programs APP1-APPN generate various block memory requests 704A-704Q, 705A-705Q, 706A-706Q, into main memory at different memory locations. At the operating system driver level, the block memory requests may be stored into a memory request buffer/queue 610. The block memory requests are arranged into a queue by the memory request buffer/queue 610 to maximize bandwidth over the memory channels in the two-dimensional memory array. Read requests may be queued together in a read request queue and write requests may be queued together in a write request queue.

A request directed to a rank of memory within a two-dimensional memory module may be referred to herein as a compound memory request or a memory module request. A compound memory request is formed of block requests for individual memory slices within a given rank. A block request may also be referred to herein as a memory slice request. If the compound memory request is a read operation, the memory slice data packed together by the memory module in response to the compound memory request may be referred to herein as a compound memory response or a memory module response. The data retrieved from a memory slice in response to the block request may be referred to herein as a block response or a memory slice response.

The block memory requests are aggregated together into compound memory requests into the two-dimensional memory array 700 by a request aggregator 612 (implemented in hardware, software, or a combination thereof) to maximize bandwidth over the memory channels therein. For example, the block memory requests 704Q, 705Q, and 706Q may be aggregated together into one read compound memory request 710 into the two-dimensional memory array 700. The compound memory request 710 includes an encoded address 712 that is encoded by an address encoder 614. Assuming eight memory slices per memory module and memory rank, the encoded address indicates the memory slice requests such as a read access to memory location A1 in memory slice MS2, memory location A9 in memory slice MS4, memory location A5 in memory slice MS5, and no memory locations in memory slices MS1, MS3, MS6, MS7, and MS8.

The compound memory request 710 may optionally include a tag 711 appended by the pending operations table 618 to indicate what pending operation is taking place in the two dimensional memory array for the give compound memory request. Otherwise, the master memory controller may limit access to the two dimensional memory to one compound memory request per rank and a tag need not be used as the master memory controller knows the expected timing of a compound memory response.

The encoded address in the compound memory request is received by one or more slave memory controllers at the slave memory control level to selectively activate one or more memory slices to perform memory operations. In response to the encoded address, selected memory in each memory slice may be activated on the various memory modules in the two-dimensional memory array 700. For example, consider the compound memory request aggregating the block memory requests 704Q, 705Q, and 706Q. The compound memory request may concurrently access different memory modules in the memory array within the same rank of memory. For example, the block memory request 704Q may respectively access a first memory module and a first rank of memory in a second memory slice MS2 to read a first memory block MB1. The block memory request 705Q may respectively access a different memory module and its first rank of memory in a fifth memory slice MS5 to read a fifth memory block MB5. The block memory request 706Q may respectively access a different memory module and its first rank of memory in a fourth memory slice MS4 to read a ninth memory block MB9.

A memory module may have a bad block of memory and be unable to use one or blocks of memory. As a result, the slave memory controller may map out the bad blocks with an address remapper 510 by remapping good physical addresses of memory into linear logical addresses (see FIG. 11 for example). While the address remapper 510 may be programmable hardware, the address remapping functionality of translating logical addresses of data blocks into physical addresses of data blocks may occur in software at the operating system driver level instead of the SMC level.

Data is accessed in the 2D memory array 700 row by row across the memory slices. The compound memory request may concurrently access data from each memory slice in the memory array row by row over different memory modules. A row of data may be formed including data responsive to the block memory requests 704Q, 705Q, and 706Q concurrently made by the compound memory request. The data for each memory slice from each memory module may be packed together into a compound memory response and made available concurrently on the data bus to the master memory controller. For example, a compound memory response 720 including packed memory slice responses 722 may be formed in response to the compound memory request 710.

Assuming eight memory slices per memory module and memory rank, the compound memory response 720 includes memory slice responses packed together, such as null data N for memory slice MS1, data D1 for memory slice MS2 (responsive to a read access to memory location A1), null data N for memory slice MS3, data D9 for memory slice MS4 (responsive to a read access to memory location A9), data D5 for memory slice MS5 (responsive to a read access to memory location A5), and null data N for memory slices MS6, MS7, and MS8.

The compound memory response 720 may optionally include the same tag 711 that was appended to the compound memory request 710. When received, the tag may indicate to the master memory controller and the pending operations table 618 that the given compound memory request into the two dimensional memory array is completed. In which case, the given entry into the pending operations table 618 may be deleted.

The row of data read out may be then transposed from rows into columns in the two-dimensional transposition buffer 602. Data access by the processor with the transpositional buffer is column by column across rows of data stored therein. In the case of a write operation, write data in the forms of blocks are transposed from columns into rows of data in the two-dimensional transposition buffer 602. With the two-dimensional transposition buffer 602, a row of data may be concurrently written into the 2D memory array with a write compound memory request.

Figure 8A:
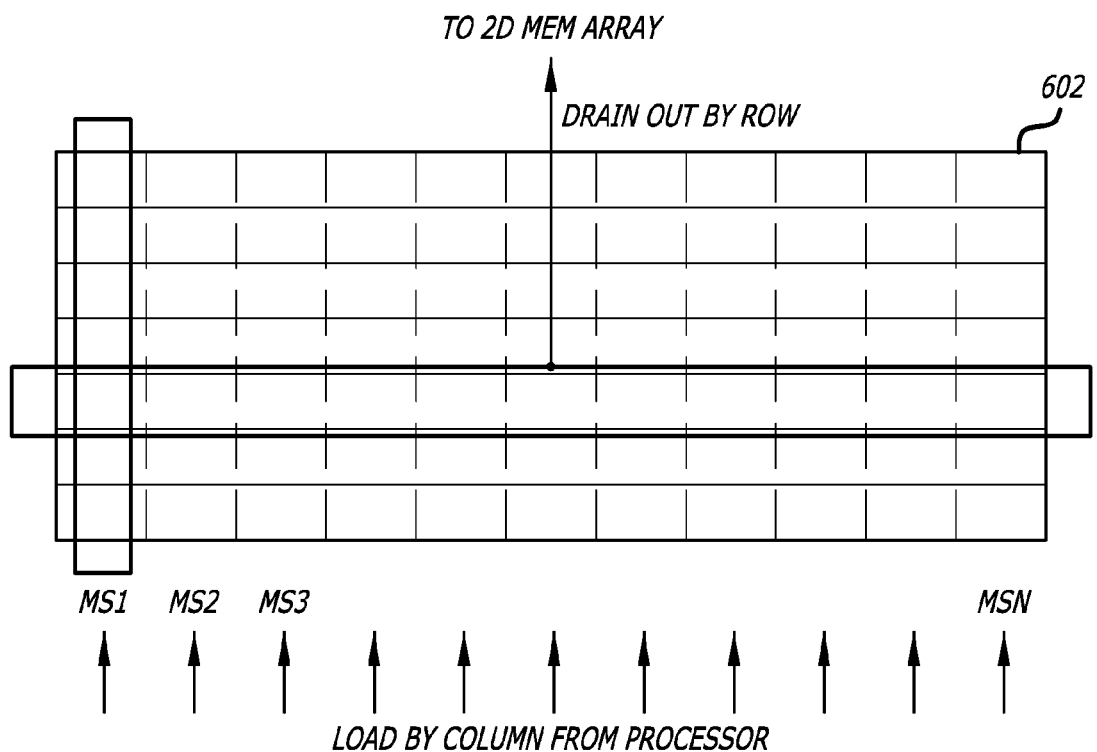
FIGS. 8A-8B are diagrams illustrating the different port interfaces to the two-dimensional transpositional buffer.

Referring now to FIG. 8A, a diagram of a transpositional buffer 602 is illustrated to further explain a write compound memory request to memory. The data to write into the two-dimension memory array is loaded by column from the I/O or processor. That is, one processor may linearly access a column of storage locations in the transpositional buffer 602 as shown in a first memory slice MS1. From the point of view of the processor, each rank of memory in the 2D memory array appears to have a linear logical address space across the address space of the plurality of memory slices MS1-MSZ as illustrated in FIG. 12A. For example in a given rank of memory, the processor may seem to be sequentially addressing through the linear logical address space of the first memory slice, MS1, before jumping over to sequentially address through the linear logical address space of the second memory slice, MS2.

A write compound memory request may wait for the aggregation of a number of block memory requests before accessing the 2D memory array. With write data stored in a sufficient number of storage locations in a row of the transpositional buffer 602, the write compound memory request may occur with a row of data being drained out of the transpositional buffer 602 and written into the memory slices in the 2D memory array. From the point of view of the master memory controller, the 2D memory array appears to have a linear logical address space within each of the plurality of memory slices MS1-MSZ as illustrated in FIG. 12B.

Referring to FIG. 12B, memory accesses into the 2D memory array are batched, aggregated, or compounded together such that each memory slice may be accessed concurrently by the master memory controller. In a typical compound memory request access into the 2D memory array, the same address (e.g., A10) for memory locations may be used into each memory slice that is activated. The address is broadcast over each memory channel bus in the two-dimensional memory array. Alternatively, different addresses may be used into each memory slice by one compound memory request (e.g., address A120 for memory slice MS1, address A90 for memory slice MS2, address A82 for memory slice MS3, address A80 for memory slice MSZ). In this case, the master memory controller initially issues a control-space write to the slave memory controllers in the 2D memory array to communicate the different addresses A120, A90, A82, A80, etc. The master memory controller can then issue a read or write respectively using a read from stored address command or a write into stored address command.

Figure 8B:
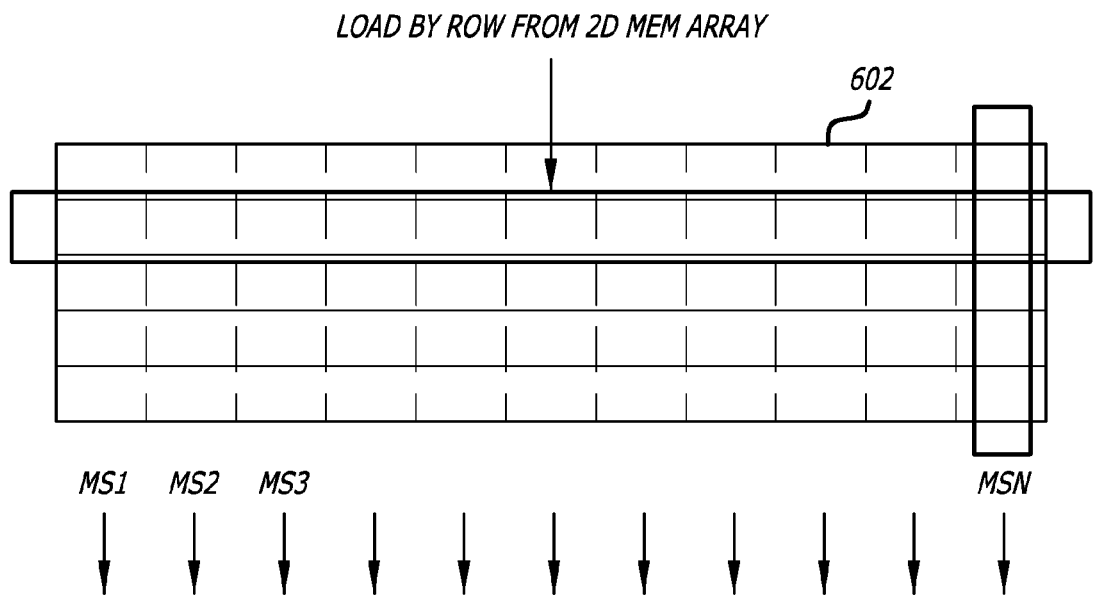

Referring now to FIG. 8B, a diagram of a transpositional buffer 602 is illustrated to further explain a read compound memory request into memory. The data read from the two-dimension memory array is loaded row by row into the storage locations in the transpositional buffer 602. The read data is drained out column by column to the I/O or processor. That is, one processor may linearly access and read a column of storage locations in the transpositional buffer as shown in an Nth memory slice MSN.

As shown and described, a single two-dimensional transposition buffer 602 may be used to support compound memory requests—one or more block memory requests for data in memory slices of a given rank. Each read compound memory request includes one or more read block memory requests to read a certain set of data blocks from memory. Each write compound memory request includes one or more write block memory requests to write a certain set of data blocks into memory. However, a given compound memory request typically does not include a combination of read block memory requests and write block memory requests to maximize data bandwidth over a channel.

The master memory controller (MMC) has full control over the one or more memory channels to which it is coupled. The master memory controller decides which compound memory request's data, of one or more outstanding compound memory requests, is to be stored into/read from the transposition buffer at a given time. The master memory controller's control over the one or more memory channels permits the same two-dimensional transposition buffer 602 to be used for both read and write operations.

Read and write operations may overlap at the memory module level as well. Write data is moved from the master memory controller into staging areas in the slave memory controller, such as the shared memory 504, so that a read data operation may occur into memory.

However if circuit area and/or power consumption are of little consequence in the master memory controller, a pair of two-dimensional transposition buffers may be used—one two-dimensional transposition buffer for read operations and another two-dimensional transposition buffer for write operations, Referring now to FIG. 9, a flow chart of a method for accessing a two-dimensional memory array is illustrated. The process begins with a start process block 900 and then goes to process block 902.

At process block 902, a plurality of block memory requests are received and stored in a buffer. The process then goes to process block 904.

At process block 904, a plurality of block memory requests stored in the buffer are combined or aggregated together into a compound memory request. The process then goes to process block 906.

At process block 906, a determination is made if the compound memory request is a write request. This may be known in advance if a memory block read request buffer and a memory block write request buffer are provided. If a write request, the process goes to process block 910. If it is not a write request (e.g., read request, erase request, etc.), the process goes to block 908.

At process block 908, a determination is made if the compound memory request is a read request. This may be known in advance if a memory block read request buffer and a memory block write request buffer are provided. If a read request, the process goes to block 914. If neither a write request or a read request (e.g., erase request), the process may go back to process block 902 and continue receiving and storing block memory requests into a buffer.

At block 910 with the compound memory request being a write request, memory block data is transposed and aggregated together as a row of data over memory slices in each memory module in the 2D memory array. The process then goes to block 912.

At process block 912, the aggregated data is concurrently written into a row over the memory slices in the 2D memory array. The process then goes back to process block 902 to continue receiving and storing block memory requests into a buffer.

At block 914, data within the memory of one or more memory modules is concurrently read and aggregated together as a memory module output response for each memory slice. The process then goes to block 916.

At block 916, the transpositional buffer is made ready to receive data in parallel for each memory slice in the memory array. The process then goes to block 918.

At process block 918, the aggregated memory slice data is transposed into memory block data and provided to an I/O device or processor. The process then goes back to process block 902 to continue receiving and storing block memory requests into a buffer.

Multi-Chip Module Packaging for Two-Dimensional Memory Modules

Referring now to FIG. 13A, a side cutaway view of a multi-chip packaged flash memory/slave memory controller (SMC) part 700A is illustrated. Multi-chip packages may also be referred to as hybrid packages or multi-chip module packages. The multi-chip packaged flash memory/slave memory controller (SMC) part 700A may be one packaged part in each memory slice.

Mounted in the multi-chip module package 701A is a slave memory controller (SMC) die 703, and pairs of a spacer and a read-writeable non-volatile memory die (flash memory die) including a first spacer 722A and a first flash memory die 118', a second spacer 722B and a second flash memory die 118', a third spacer 722C and a third flash memory die 118', and an Nth spacer 722N and an Nth flash memory die 118' stacked together as shown. The slave memory controller (SMC) die may include an integrated processor and/or an integrated scratch pad memory coupled to the processor. The read-writeable non-volatile memory die (flash memory die) 118' may be NOR-gate flash electrically erasable programmable read only memory (EEPROM) integrated circuits or NAND-gate flash electrically erasable programmable read only memory (EEPROM) integrated circuits.

The spacer 722A may be the size of the slave memory controller (SMC) die 703 as shown or somewhat smaller than the size of the flash memory 118' so that contacts may be made to the slave memory controller (SMC) die 703 and the first flash memory die 118'. The flash memory die 118' is larger than the spacers 722B-722N to provide an opening into a perimeter of the flash memory dice 118' so that electrical connections may be made.

In other implementations, the spacer may be applied after a flash die 118' is connected to a substrate of the package. The spacer may cover the areas on the flash memory die 118' to which it was connected.

The spacers 722A-722N may be a dielectric or insulator so that the SMC die 703 and flash memory dice 118' do not short out to each other. Otherwise, the spacers do not include any active devices or metal routing, unless buried under the surface, so that it will not short wires or signal lines together.

The SMC and the flash memory dice 118' may be coupled together at joint package pads/pins 750J. For example, conductors 705A and 705B may couple signals of the slave memory controller (SMC) die 703 to a connection on the top flash memory die 118' and thence to the joint package pads 750J by means of conductors 710A and 711A respectively. Connections on other levels of flash memory die 118' may couple to the same joint package pad 750J by conductors 710B-710N and 711B-711N respectively. That is, the other flash memory dies 118' are connected to the slave memory controller (SMC) die by way of multiple connections to the joint package pads/pins 750J.

The slave memory controller (SMC) die 703 and each flash memory dice 118' may directly and independently couple to independent package pads/pins 750I of the package. For example, the SMC die 703 may couple to independent package pads/pins 750I by means of conductors 706A-706N and 708. The N flash memory dice 118' may directly and independently couple to their own respective independent package pads/pins 750I by means of conductors 707A-707N. The conductors 707A-707N coupled to the respective independent package pads/pins 750I may be a chip enable signal to activate the flash memory die or not.

An encapsulant 721 may also be used to protect the devices mounted in the package 701B and keep conductors from shorting to each other.

Referring now to FIG. 13B, a side cutaway view of a multi-chip packaged flash memory/slave memory controller (SMC)/processor part 700B is illustrated. Multi-chip packages may also be referred to as hybrid packages or multi-chip module packages. The multi-chip packaged flash memory/slave memory controller (SMC)/processor part 700B may be one packaged part in each memory slice.

Mounted in the multi-chip module package 701B is a slave memory controller (SMC) die 703, a first spacer 722A, a processor 730, a second spacer 722B, a scratch pad memory 732, and pairs of a spacer and a flash memory die including a spacer 722C and a flash memory die 118', and an Nth spacer 722N and an Nth flash memory die 118' stacked together as shown. The scratch pad memory 732, a random access memory (RAM), may alternatively be packaged separate and apart from the slave memory controller die 703.

The spacer 722A may be the size of the slave memory controller (SMC) die 703 as shown or somewhat smaller than the size of the processor 730 so that contacts may be made to the slave memory controller (SMC) die 703 and the processor die 730.

The scratch pad memory die 732 is larger than the spacer 722B to provide an opening into a perimeter of the flash so that electrical connections may be made, such as between the processor 730 and the memory 732 or from the memory to a pad.

The flash memory die 118' is larger than the spacers 722C-722N to provide an opening into a perimeter of the flash memory dice 118' so that electrical connections may be made.

In other implementations, the spacer may be applied after a flash die 118' is connected to a substrate of the package. The spacer may cover the areas on the flash memory die 118' to which it was connected.

The SMC and the processor, the SMC and the flash memory dice 118', or the processor and scratch pad memory may be coupled together at joint package pads/pins 750J by means of conductors (e.g., 710A-710N, 711A-711N).

The slave memory controller (SMC) die 703, the processor, the scratch pad memory, and each flash memory dice 118' may directly and independently couple to independent package pads/pins 750I of the package by means of conductors (e.g., 706A-706N, 707A-707N, and 708).

An encapsulant 721 may also be used to protect the devices mounted in the package 701B and keep conductors from shorting to each other.

Conclusion

While this specification includes many specifics, these should not be construed as limitations on the scope of the disclosure or of what may be claimed, but rather as descriptions of features specific to particular implementations of the disclosure. Certain features that are described in this specification in the context of separate implementations also may be implemented in combination in a single implementation. Conversely, various features that are described in the context of a single implementation also may be implemented in multiple implementations separately or in sub-combination. Moreover, although features may be described above as acting in certain combinations and even initially claimed as such, one or more features from a claimed combination may in some cases be excised from the combination, and the claimed combination may be directed to a sub-combination or variation of a sub-combination.

A number of features described may be implemented in software. When implemented in software, the processes of the embodiments of the invention are essentially the code segments to perform the necessary tasks. The program or code segments can be stored in a processor readable medium or transmitted by a computer data signal embodied in a carrier wave over a transmission medium or communication link. The "processor readable medium" may include any medium that can store information. Examples of the processor readable medium include an electronic circuit, a semiconductor memory device, a read only memory (ROM), a flash memory, an erasable programmable read only memory (EPROM), a floppy diskette, a CD-ROM, an optical disk, or a hard disk. The code segments may be downloaded via computer networks such as the Internet, Intranet, etc. over a transmission medium such as electronic network channels, optical fibers, air, electromagnetic, RF links, etc. for storage into the "processor readable medium".

A number of implementations have been described. Nevertheless, it will be understood that various modifications may be made without departing from the spirit and scope of the disclosure. Other implementations are within the scope of the following claims. For example, the memory modules and the memory sockets have been described as being dual in-line memory modules (DIMM) and DIMM sockets. However, the memory modules and memory sockets may have other types of form factors, such as single in-line memory modules (SIMM), for example.

What is claimed is:

1. A multi-chip packaged integrated circuit part to mount to a printed circuit board of a memory module, the multi-chip packaged integrated circuit part comprising:
    an integrated circuit package including
        a slave memory controller (SMC) die;
        one or more pairs of
            a spacer under the slave memory controller die, and
            a flash memory die under the spacer,
                wherein the flash memory die is larger than the spacer to provide an opening into a perimeter of the flash memory die to which electrical connections may be made;
        a first plurality of conductors electrically coupling the slave memory controller die to one or more independent pads of a pin-out of the integrated circuit package;
        a second plurality of conductors electrically coupling the slave memory controller die to one or more joint pads of the pin-out; and
        a third plurality of conductors electrically coupling one or more of the flash memory die to the one or more joint pads of the pin-out to electrically couple the flash memory die to the slave memory control die.

2. The multi-chip packaged integrated circuit part of claim 1, wherein
    the integrated circuit package is a multi-chip module integrated circuit package.

3. The multi-chip packaged integrated circuit part of claim 1, wherein
   each of the spacers is a dielectric or insulator so active portions of the circuitry of the flash memory die do not short to active portions of a neighboring integrated circuit die.

4. A multi-chip packaged integrated circuit part to mount to a printed circuit board of a memory module, the multi-chip packaged integrated circuit part comprising:
   an integrated circuit package including
      a slave memory controller die including a processor; and
      one or more pairs of
         a spacer under the slave memory controller die, and
         a flash memory die under the spacer,
            wherein the flash memory die is larger than the spacer to provide an opening into a perimeter of the flash memory die to which electrical connections may be made.

5. The multi-chip packaged integrated circuit part of claim 4, wherein
   the slave memory controller die further includes a scratch pad memory coupled to the processor.

6. A multi-chip packaged integrated circuit part to mount to a printed circuit board of a memory module, the multi-chip packaged integrated circuit part comprising:
   an integrated circuit part including
      a slave memory controller (SMC) die;
      a first spacer under the slave memory controller die;
      a processor die under the first spacer;
      a second spacer under the processor;
      a scratch pad memory die under the second spacer; and
      under the scratch pad memory die, one or more pairs of
         a third spacer under the scratch pad memory die, and
         a flash memory die under the third spacer.

7. The multi-chip packaged integrated circuit part of claim 6, further comprising:
   a first plurality of conductors to electrically coupled the slave memory controller die to one or more independent pads of a pin-out of the integrated circuit package;
   a second plurality of conductors to electrically couple the slave memory controller die to one or more joint pads of the pin-out; and
   a third plurality of conductors to electrically couple one or more of the flash memory die to the one or more joint pads of the pin-out to electrically couple the flash memory die to the slave memory control die.

8. The multi-chip packaged integrated circuit part of claim 6, wherein
   each of the spacers is a dielectric or insulator so active portions of the circuitry of the flash memory die do not short to active portions of a neighboring integrated circuit die.

9. The multi-chip packaged integrated circuit part of claim 6, wherein
   the integrated circuit package is a multi-chip module integrated circuit package.

10. The multi-chip packaged integrated circuit part of claim 6, wherein
    the scratch pad memory die is coupled to the processor die.

11. The multi-chip packaged integrated circuit part of claim 4, wherein
    the integrated circuit package is a multi-chip module integrated circuit package.

12. The multi-chip packaged integrated circuit part of claim 4, further comprising:
    a first plurality of conductors to electrically coupled the slave memory controller die to one or more independent pads of a pin-out of the integrated circuit package;
    a second plurality of conductors to electrically couple the slave memory controller die to one or more joint pads of the pin-out; and
    a third plurality of conductors to electrically couple one or more of the flash memory die to the one or more joint pads of the pin-out to electrically couple the flash memory die to the slave memory control die.

13. The multi-chip packaged integrated circuit part of claim 4, wherein
    each of the spacers is a dielectric or insulator so active portions of the circuitry of the flash memory die do not short to active portions of a neighboring integrated circuit die.

* * * * *